United States Patent
Kanaoka et al.

(10) Patent No.: US 8,042,030 B2
(45) Date of Patent: Oct. 18, 2011

(54) ENCODING APPARATUS, DECODING APPARATUS, ENCODING METHOD, DECODING METHOD, AND STORAGE DEVICE

(75) Inventors: Toshikazu Kanaoka, Kawasaki (JP); Toshio Ito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1084 days.

(21) Appl. No.: 11/891,043

(22) Filed: Aug. 8, 2007

(65) Prior Publication Data

US 2008/0040651 A1    Feb. 14, 2008

(30) Foreign Application Priority Data

Aug. 9, 2006  (JP) ................. 2006-217444
May 18, 2007  (JP) ................. 2007-133503

(51) Int. Cl.
 *H03M 13/03* (2006.01)
(52) U.S. Cl. ................ 714/794; 714/800
(58) Field of Classification Search ............. 714/794, 714/800
See application file for complete search history.

(56) References Cited

U.S. PATENT DOCUMENTS

| 6,895,547 | B2 | 5/2005 | Eleftheriou et al. |
| 2003/0037300 | A1* | 2/2003 | Kondo et al. ................. 714/794 |
| 2005/0120286 | A1 | 6/2005 | Akamatsu |
| 2005/0240856 | A1 | 10/2005 | Hayashi |

FOREIGN PATENT DOCUMENTS

| JP | 2005-166089 A | 6/2005 |
| JP | 2006-060296 A | 3/2006 |
| KR | 10-2005-0098757 | 10/2005 |

OTHER PUBLICATIONS

Nikolaos Thomos; "Product Code Optimization for Determinate state LDPC Decoding in Robust Image Transmission"; IEEE Trans. on Image Processing, vol. 15, No. 8; Aug. 2006; pp. 2113-2119.
Japanese Office Action mailed Aug. 2, 2011 for corresponding Japanese Application No. 2007-133503, with English-language Translation.

* cited by examiner

*Primary Examiner* — Sam Rizk
(74) *Attorney, Agent, or Firm* — Fujitsu Patent Center

(57) ABSTRACT

An ECC decoder outputs, to a likelihood substituting unit, information on data in data blocks that is corrected to be valid. Based on the information, the likelihood substituting unit substitutes likelihood corresponding to the data corrected to be valid by the maximum value, and outputs it to an LDPC decoder. The LDPC decoder decodes user data with likelihoods partly substituted by the maximum value using LDPC parity, and calculates likelihood of data that constitutes the user data. The LDPC decoder outputs the calculated likelihood to a channel APP decoder as external data.

22 Claims, 24 Drawing Sheets

US 8,042,030 B2

ENCODING APPARATUS, DECODING APPARATUS, ENCODING METHOD, DECODING METHOD, AND STORAGE DEVICE

BACKGROUND OF THE INVENTION

1. Field of the Invention

The present invention generally relates to a technology for correcting data error. The present invention specifically relates to a technology for decoding reproduced data.

2. Description of the Related Art

Recently, a low-density parity-check (LDPC) code is drawing attention as a next generation error correcting technology. For example, U.S. Pat. No. 6,895,547 discloses a method for LDPC encoding of data. The LDPC code indicates a linear code that is regulated such that the number of "1" included in a parity check matrix is reduced (becomes low density).

Regulating the LDPC code such that the number of "1" included in the parity check matrix is reduced enables an iterative decoding called belief propagation (BP) method using an algorithm such as sum-product algorithm and a min-sum algorithm. Further, increasing a code length of the LDPC code and including random nature enables to realize a significantly greater correcting ability than the correcting ability of a code used in a conventional error correction (Humming code or Reed-Solomon Code etc.).

Applying the LDPC code to a digital signal process of a storage device such as a magnetic disk device is examined. FIG. 23 is a block diagram for explaining the conventional technology, i.e., the digital signal process of an encoding/decoding unit of a magnetic disk device using the LDPC code.

The encoding/decoding unit includes an error correcting code (ECC) encoder and an LDPC encoder that carry out an encoding process, a partial response (PR) channel that carries out a recording/reproducing process, and a channel A posteriori probability (APP) decoder, an LDPC decoder, a determination output unit, and an ECC decoder that carry out a decoding process.

The encoding process of the encoding/decoding unit is explained first. The ECC encoder outputs, to the LDPC encoder, an encoded sequence b that is obtained by carrying out error correction encoding on a data bit sequence u. The LDPC encoder carries out LDPC encoding on the encoded sequence b received from the ECC encoder and outputs data c to the PR channel. The recording/reproducing process is explained next. The PR channel records the data c received from the LDPC encoder on the disk, and outputs a reproduced signal y from the disk to the channel APP decoder.

The decoding process is explained next. Based on the reproduced signals y received from the PR channel and prior data (no prior data for the first decoding process), the channel APP decoder decodes a posterior probability likelihood L(c) for the data c and outputs the posterior probability likelihood L(c) to the LDPC decoder. The LDPC decoder carries out belief propagation decoding on the posterior probability likelihood L(c) received from the channel APP decoder and outputs, to the channel APP decoder, external data $L_e(c)$ with updated likelihood (highest degree of reliability) as prior data. After repeating the aforementioned operations in the decoding process for a predetermined number of times, the LDPC decoder outputs the posterior probability likelihood L(b) to the determination output unit. The determination output unit determines a threshold value of the posterior probability likelihood L(b) received from the LDPC decoder and outputs a resultant decoded bit sequence b to the ECC decoder. The ECC decoder carries out symbol correction on the decoded bit sequence b received from the determination output unit and obtains a decoded data bit sequence u.

As described above, the channel APP decoder decodes posterior probability likelihood L(c) for the data c, and outputs the result to the LDPC decoder. The definition of the likelihood is explained with reference to FIG. 24. The likelihood can be obtained as:

$$L(c)=\log\{P1(c=1|y)/P0(c=0|y)\}$$

where P1 is a probability at which the data has a value 1, while P0 is a probability at which the data has a value 0. That is, the likelihood L(c) is, as shown in FIG. 24, represents the possibility of whether the data has a value 0 or 1. Specifically, the likelihood for data with a value 0 is represented by a negative maximum value $(-\infty)$, while the likelihood for data with a value 1 is represented by a positive maximum value $(+\infty)$. When it cannot be determined whether the data has a value 0 or 1, the likelihood will be zero (0).

A scheme has been proposed by Nikolaos Thomos, Nikolaos V. Boulgouris, and Michael G. Strintzis, "Product Code Optimization for Determinate State LDPC Decoding in Robust Image Transmission", IEEE trans. Image Process., vol. 15, No. 8, pp. 2113-2119, August 2006, which employs a product coder consisting of LDPC codes and Reed-Solomon (RS) codes to deal with bit errors. The likelihood of determinate data, in which errors have been corrected with RS codes, is set to a large value, and used in LDPC decoding.

However, if the LDPC code is applied as the error correcting technology to the storage device such as the magnetic disk device, burst errors that originate due to a defect of data cannot be corrected. In other words, because the LDPC code randomizes the error and repeat propagates data to greatly enhance the error correcting ability, if a decoder that performs LDPC decoding is applied to the storage device such as the magnetic disk device, relatively large errors such as the burst errors are propagated (distributed). As a result, the errors reach a correction limit of an error correcting decoder (e.g., ECC decoder), and the burst errors cannot be corrected.

The aforementioned drawback is not limited to when the LDPC code is applied to the storage device such as the magnetic disk device. Application of the LDPC code to the digital signal process in storage goods such as an optical disk or in the field of communication such as a wireless local area network (LAN), wireless Internet, long distance optical communication etc. also results in a similar drawback.

Moreover, application of a turbo code, which includes functions that are similar to the functions of the LDPC code, to the storage device such as the magnetic disk device also results in the similar drawback.

SUMMARY OF THE INVENTION

It is an object of the present invention to at least partially solve the problems in the conventional technology.

According to an aspect of the present invention, an encoding apparatus that encodes data, includes a first encoding unit that performs first encoding for calculating validity and a likelihood ratio of data that constitutes user data to generate first encoded data, and adds the first encoded data to the user data to obtain first data, and a second encoding unit that divides the first data into data blocks, performs second encoding for determining validity of data in each of the data blocks to generate second encoded data, and adds the second encoded data to the first data to obtain second data.

According to another aspect of the present invention, a decoding apparatus decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks. The decoding apparatus includes a likelihood decoding unit that decodes the reproduced data of the second data and calculates a likelihood ratio of data that constitutes the second data, a first decoding unit that divides the first data in the second data into the data blocks after decoding by the likelihood decoding unit, and performs decoding using the second encoded data to check the validity of data in each of the data blocks, a likelihood resetting unit that resets a likelihood ratio of data with no error to a maximum value based on a result of the decoding by the first decoding unit, and a second decoding unit that decodes user data with the likelihood ratio reset to the maximum value using the first encoded data, and calculates the likelihood ratio of the data that constitutes the user data.

According to still another aspect of the present invention, a decoding apparatus decodes reproduced data of third data that includes first data obtained by generating first encoded data with first encoding for calculating validity and a likelihood ratio of data that constitutes user data and adding the first encoded data to the user data, and third encoded data generated by, after the first data is divided into data blocks, third encoding for determining validity of data in each of the data blocks and correcting invalid data to be valid within a correctable range. The decoding apparatus includes a likelihood decoding unit that decodes the reproduced data of the third data and calculates a likelihood ratio of data that constitutes the third data, a third decoding unit that divides the first data in the third data into the data blocks after decoding by the likelihood decoding unit, and performs decoding using the third encoded data to check the validity of data in each of the data blocks and correct invalid data to be valid within the correctable range, a likelihood resetting unit that resets a likelihood ratio of data corrected to be valid to a maximum value based on a result of decoding by the third decoding unit, and a second decoding unit that decodes user data with the likelihood ratio reset to the maximum value using the first encoded data, and calculates the likelihood ratio of the data that constitutes the user data.

According to still another aspect of the present invention, a decoding apparatus decodes reproduced data of second data that includes user data, first encoded data generated by, after the user data is divided into data blocks, first encoding for determining validity of data in each of the data blocks and correcting invalid data to be valid within a correctable range, and second encoded data generated by second encoding for calculating a likelihood ratio of data that constitutes first data obtained by adding the first encoded data to the user data. The decoding apparatus includes a likelihood decoding unit that decodes the reproduced data of the second data and calculates a likelihood ratio of data that constitutes the second data, a first decoding unit that decodes the first data in the second data after decoding by the likelihood decoding unit using the second encoded data and calculates a likelihood ratio of the data that constitutes the first data, a second decoding unit that divides the first data decoded by the first decoding unit into data blocks, and performs decoding using the first encoded data to check the validity of data in each of the data blocks and correct invalid data to be valid within the correctable range, and a likelihood resetting unit that resets a likelihood ratio of data corrected to be valid to a maximum value based on a result of the decoding by the second decoding unit. The likelihood decoding unit decodes the reproduced data of the second data each time the likelihood ratio of the data that constitutes the first data is calculated, and recalculates the likelihood ratio of the data that constitutes the second data. The first decoding unit calculates the likelihood ratio of the data that constitutes the first data each time the likelihood ratio of the data that constitutes the second data is calculated. The second decoding unit performs the decoding each time the likelihood ratio of the data that constitutes the first data is calculated. The likelihood resetting unit resets, each time invalid data in the data blocks is corrected to be valid, a likelihood ratio of the data to the maximum value.

According to still another aspect of the present invention, an encoding method of data includes performing first encoding for calculating validity and a likelihood ratio of data that constitutes user data to generate first encoded data, adding the first encoded data to the user data to obtain first data, dividing the first data into data blocks, performing second encoding for determining validity of data in each of the data blocks to generate second encoded data, and adding the second encoded data to the first data to obtain second data.

According to still another aspect of the present invention, a decoding method is applied to a decoding apparatus that decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks. The decoding method includes decoding the reproduced data of the second data to calculate a likelihood ratio of data that constitutes the second data, dividing the first data in the second data into the data blocks after decoding, performing first decoding with the second encoded data to check the validity of data in each of the data blocks, resetting a likelihood ratio of data with no error to a maximum value based on a result of the first decoding, and performing second decoding to decode user data with the likelihood ratio reset to the maximum value using the first encoded data to calculate the likelihood ratio of the data that constitutes the user data.

According to still another aspect of the present invention, a decoding method is applied to a decoding apparatus that decodes reproduced data of third data that includes first data obtained by generating first encoded data with first encoding for calculating validity and a likelihood ratio of data that constitutes user data and adding the first encoded data to the user data, and third encoded data generated by, after the first data is divided into data blocks, third encoding for determining validity of data in each of the data blocks and correcting invalid data to be valid within a correctable range. The decoding method includes decoding the reproduced data of the third data to calculate a likelihood ratio of data that constitutes the third data, dividing the first data in the third data into the data blocks after decoding, performing third decoding with the third encoded data to check the validity of data in each of the data blocks and correct invalid data to be valid within the correctable range, resetting a likelihood ratio of data corrected to be valid to a maximum value based on a result of the third decoding, and performing second decoding to decode user data with the likelihood ratio reset to the maximum value using the first encoded data to calculate the likelihood ratio of the data that constitutes the user data.

According to still another aspect of the present invention, a storage device includes an encoding apparatus that encodes data, and a decoding apparatus that decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks. The encoding apparatus includes a first encoding unit that performs first encoding for calculating validity and a likelihood ratio of data that constitutes user data to generate first encoded data, and adds the first encoded data to the user data to obtain first data, and a second encoding unit that divides the first data into data blocks, performs second encoding for determining validity of data in each of the data blocks to generate second encoded data, and adds the second encoded data to the first data to obtain second data. The decoding apparatus includes a likelihood decoding unit that decodes the reproduced data of the second data and calculates a likelihood ratio of data that constitutes the second data, a first decoding unit that divides the first data in the second data into the data blocks after decoding by the likelihood decoding unit, and performs decoding using the second encoded data to check the validity of data in each of the data blocks, a likelihood resetting unit that resets a likelihood ratio of data with no error to a maximum value based on a result of the decoding by the first decoding unit, and a second decoding unit that decodes user data with the likelihood ratio reset to the maximum value using the first encoded data, and calculates the likelihood ratio of the data that constitutes the user data.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention are explained below with reference to the accompanying drawings. The embodiments are explained as being applied to a magnetic disk device.

Figure 1:
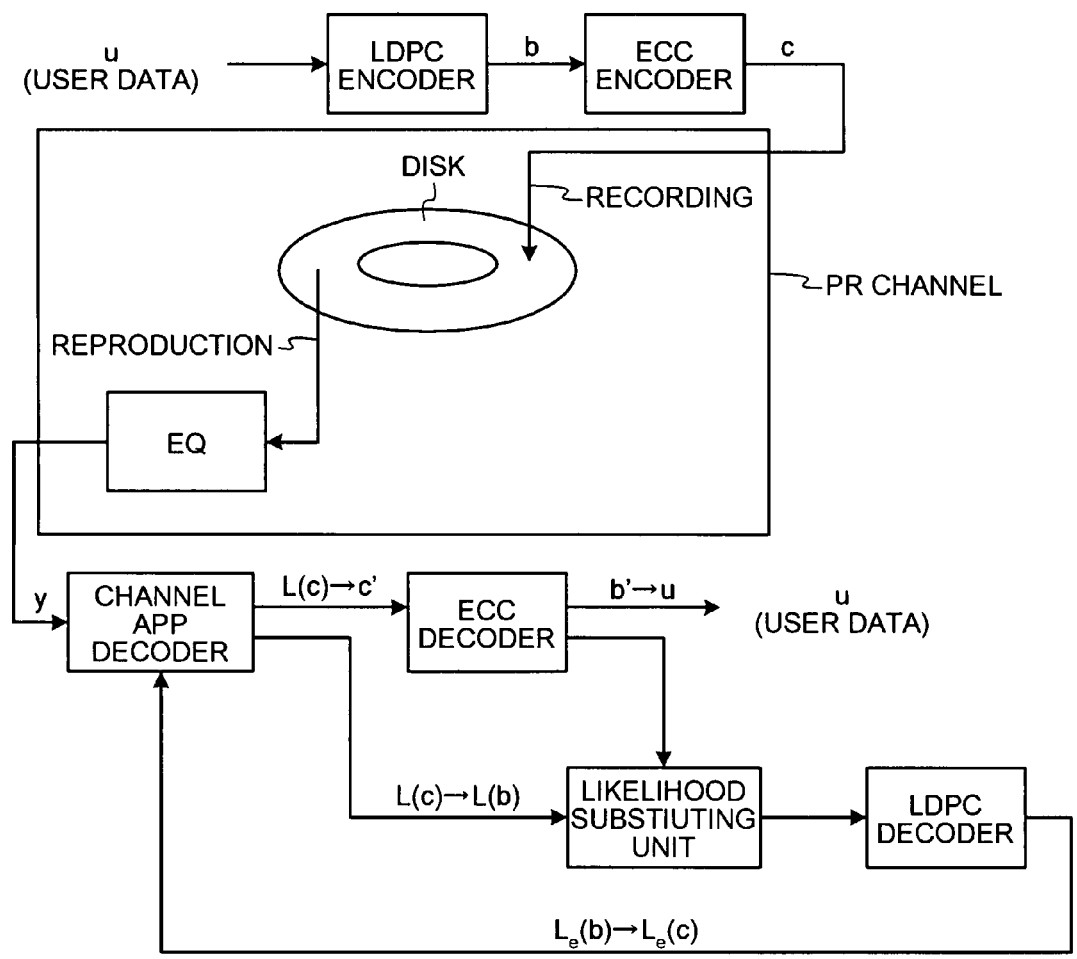
FIG. 1 is a schematic diagram for explaining an outline and a salient feature of a magnetic disk device according to a first embodiment of the present invention.

FIG. 1 is a schematic diagram for explaining the outline and the salient feature of the magnetic disk device according to a first embodiment of the present invention. As shown in FIG. 1, if reproduced data (signals), which is obtained by reproducing user data recorded on a disk, includes errors, the magnetic disk device according to the first embodiment corrects the errors. Specifically, the magnetic disk device corrects burst errors that originate due to a defect of data.

The salient feature is specifically explained. An LDPC encoder of the magnetic disk device according to the first embodiment carries out LDPC encoding on user data u, adds the generated encoded data (LDPC parity) to the user data u, and outputs resultant data b to an ECC encoder. The ECC encoder splits the data b received from the LDPC encoder into L data blocks, carries out ECC encoding on data of each data block, adds resultant encoded data (ECC parities) to the data b, and outputs resultant data c to a PR channel that is a recording and reproducing system of the magnetic disk device. The PR channel records the data c in a disk.

The PR channel uses an equalizer (EQ) to equalize to a desired PR waveform, a magnetic recording reproduction waveform of reproduced data y of the data c recorded on the disk, and outputs the reproduced data y to a channel APP decoder. Incidentally, a decoder other than channel APP decoder can be used that uses an algorithm such as a Bahl, Cocke, Jelinek, Raviv (BCJR) algorithm, a maximum a posteriori probability (MAP) algorithm, and a soft output viterbi algorithm (SOVA). The channel APP decoder decodes the reproduced data y received from the PR channel, calculates likelihood $L(c)$ (e.g., soft data that indicates, for each data represented by 0, 1 or a combination of 0 and 1, possibility as to whether the data is represented by 0 or 1) of each data constituting the reproduced data y, and outputs the likelihoods $L(c)$ to an ECC decoder and a likelihood substituting unit. The likelihoods $L(c)$ output to the ECC decoder are converted into binary data c' (data represented by a combination of 1 and 0) before input to the ECC decoder. Before input to the likelihood substituting unit, the likelihoods L(c) becomes likelihoods L(b) from which the ECC parities are deleted.

After splitting the binary data c' into, for example, L data blocks, the ECC decoder uses ECC parities corresponding to the respective data blocks to decode the data, determines validity of data of each data block (whether data errors exist), and corrects invalid data to be valid within a correctable range (error-correction range). Then, the ECC decoder determines whether any error is left uncorrected with respect to each data block. If there is no error, the ECC decoder outputs data b' obtained by integrating the data after error correction. The LDPC parity is deleted from the data b' output from the ECC decoder and the user data u is obtained.

If there is any data block in which an error remains, the ECC decoder outputs data of each data block that has been corrected to be valid to the likelihood substituting unit. Having received the data that has been corrected to be valid, the likelihood substituting unit substitutes a maximum value for the likelihood L(b) corresponding to the data of each data block corrected to be valid, and outputs the user data to the LDPC decoder.

By using the LDPC parity, the LDPC decoder decodes the user data with the likelihoods partly substituted by the maximum value (belief propagation decoding), and calculates the likelihood of each data constituting the user data (recalculates, for each data, possibility as to whether the data is represented by 0 or 1). Next, the LDPC decoder outputs the calculated likelihood of each data to the channel APP decoder as the external data $L_e(b)$. Before input to the channel APP decoder, the external data $L_e(b)$ output to the channel APP decoder becomes data $L_e(c)$ that includes additional dummy likelihoods instead of the ECC parities.

When calculating the likelihood L(c) of each data constituting the reproduced data y by decoding the reproduced data y once again, the channel APP decoder uses, as prior data, the external data $L_e(b)$ received from the LDPC decoder. Next, the channel APP decoder reoutputs, to the ECC decoder and the likelihood substituting unit, the likelihoods L(c) calculated by decoding the reproduced data y. Thus, the decoding process of the likelihoods L(c) is repeated between the channel APP decoder and the LDPC decoder, and if all the errors are corrected in the ECC decoder or the LDPC decoder, the final user data u is obtained.

Figure 2:
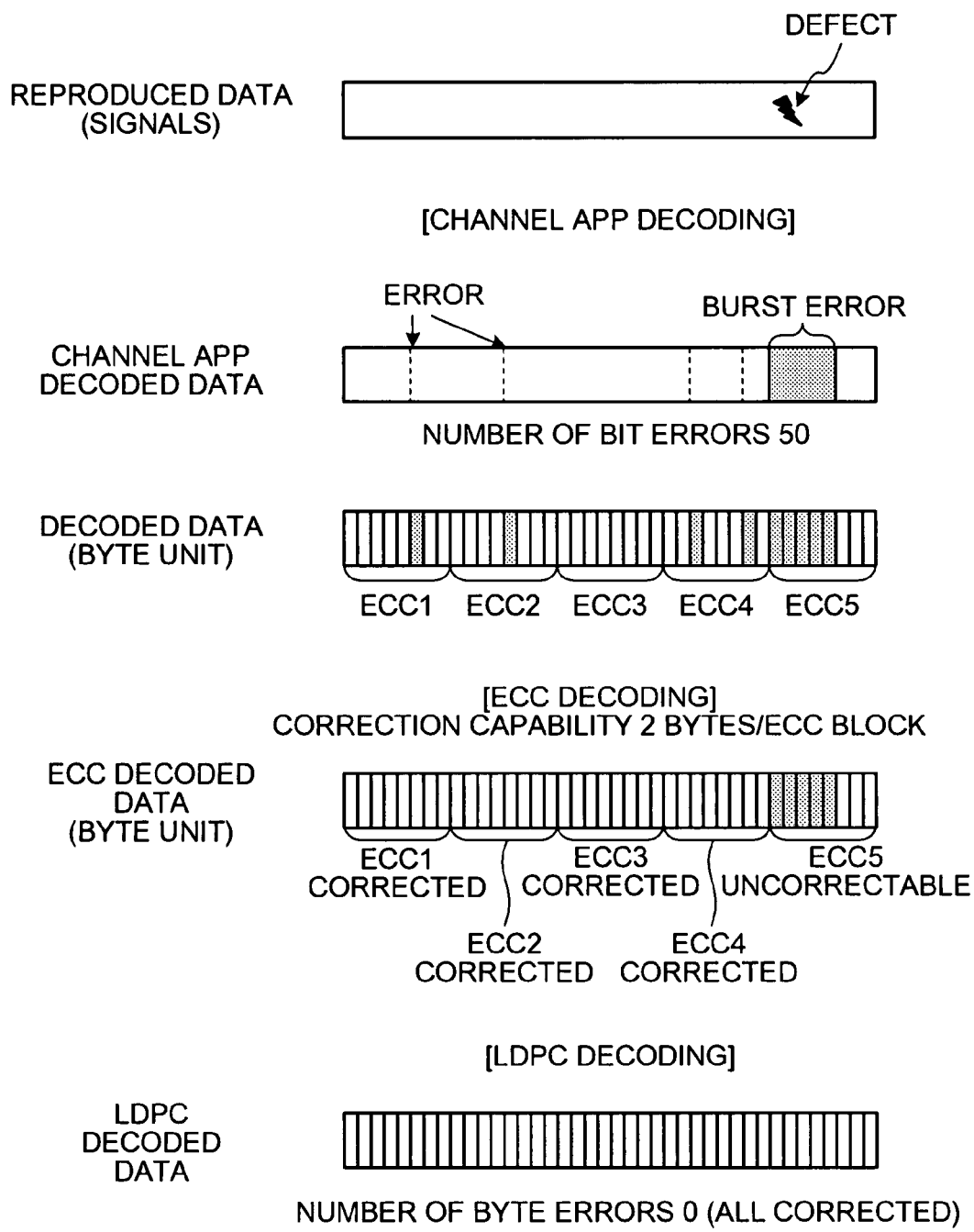
FIG. 2 is a schematic diagram for explaining an outline of data error correction according to the first embodiment.

An outline of data error correction according to the first embodiment is explained below. As shown in FIG. 2, the channel APP decoder, for example, decodes the reproduced data (signals) including errors and outputs the decoded data (likelihoods) to the ECC decoder. The decoded data with 50 bit errors output from the channel APP decoder is converted into binary data. The ECC decoder splits the binary data into data blocks (e.g., data blocks ECC1 to ECC5), uses the ECC parities to decode the binary data, and corrects the binary data to be valid within the correctable range (e.g., 2 bytes per block). Next, the ECC decoder outputs data of the data blocks ECC1 to ECC4 corrected to be valid to the likelihood substituting unit. The likelihood substituting unit substitutes the maximum value for each of the likelihoods corresponding to the data blocks corrected by the ECC decoder to be valid, and outputs the decoded data to the LDPC decoder. The LDPC decoder uses the LDPC parity to decode the decoded data received from the likelihood substituting unit. Enabling to temporarily convert the likelihoods of all the data blocks to the maximum value indicates that all the byte errors are corrected, and the user data can be obtained. Or as a result of the decoding by the LDPC decoder, if remaining errors in the decoded data fall within the correctable range of the ECC decoder, the ECC decoder corrects the remaining errors to obtain valid data. Thus, all the byte errors are corrected and the user data can be obtained.

The magnetic disk device according to the first embodiment fixes, to the maximum value, the likelihood of each data of the data blocks corrected to be valid by a RS code or a Bose Ray-Chaudhury Hoquenghem (BCH) code, and uses the maximum value of the likelihood for decoding using the LDPC code or a turbo code. Due to this, the magnetic disk device according to the first embodiment can ensure a consistency between the encoding using the LDPC code or the turbo code and the encoding using the RS code and the BCH code (i.e., the magnetic disk device can appropriately link and use soft data and hard data), and the burst errors can be corrected. Moreover, the magnetic disk device according to the first embodiment repeatedly performs error correction of the reproduced data of the user data, substitution of the likelihoods according to an error correction result, and decoding of the likelihoods using a substitution result of the likelihoods. Thus, iterative decoding of the likelihoods can be carried out while the likelihood of data with no error or data corrected to be valid is fixed, and the burst error can be accurately corrected.

Figure 3:
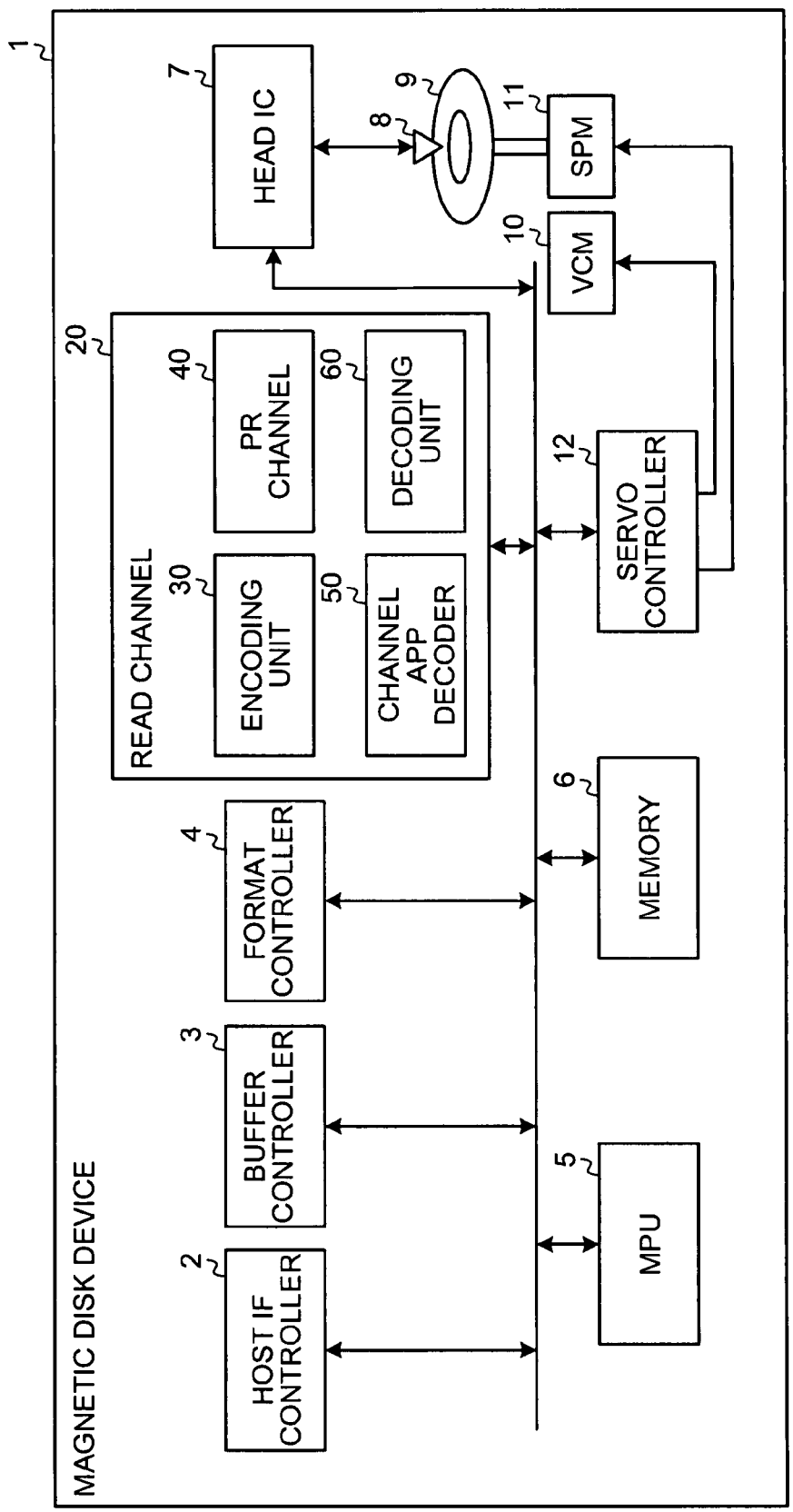
FIG. 3 is a block diagram of the magnetic disk device.

FIG. 3 is a block diagram of a magnetic disk device 1 according to the first embodiment. The magnetic disk device 1 includes a host interface (IF) controller 2 that controls communication related to various types of data transacted between a host and the magnetic disk device 1, a buffer controller 3 that controls a buffer memory, a format controller 4 that controls recording and reproduction of data, a micro processor unit (MPU) 5 that carries out main control of the magnetic disk device 1, a memory 6 that stores therein data and programs for control, a head integrated circuit (IC) 7, a head 8, a disk 9, a voice coil motor (VCM) 10, a spindle motor (SPM) 11, a servo controller 12 that controls operations of the VCM 10 and the SPM 11, and a read channel 20.

The read channel 20 controls encoding of the data received from the host IF controller 2 (e.g., the user data u) and recording of the data to the disk 9. Further, the read channel 20 also controls reproduction and decoding of the user data recorded on the disk 9. The read channel 20 includes an encoding unit 30, a PR channel 40, a channel APP decoder 50, and a decoding unit 60.

Figure 4:
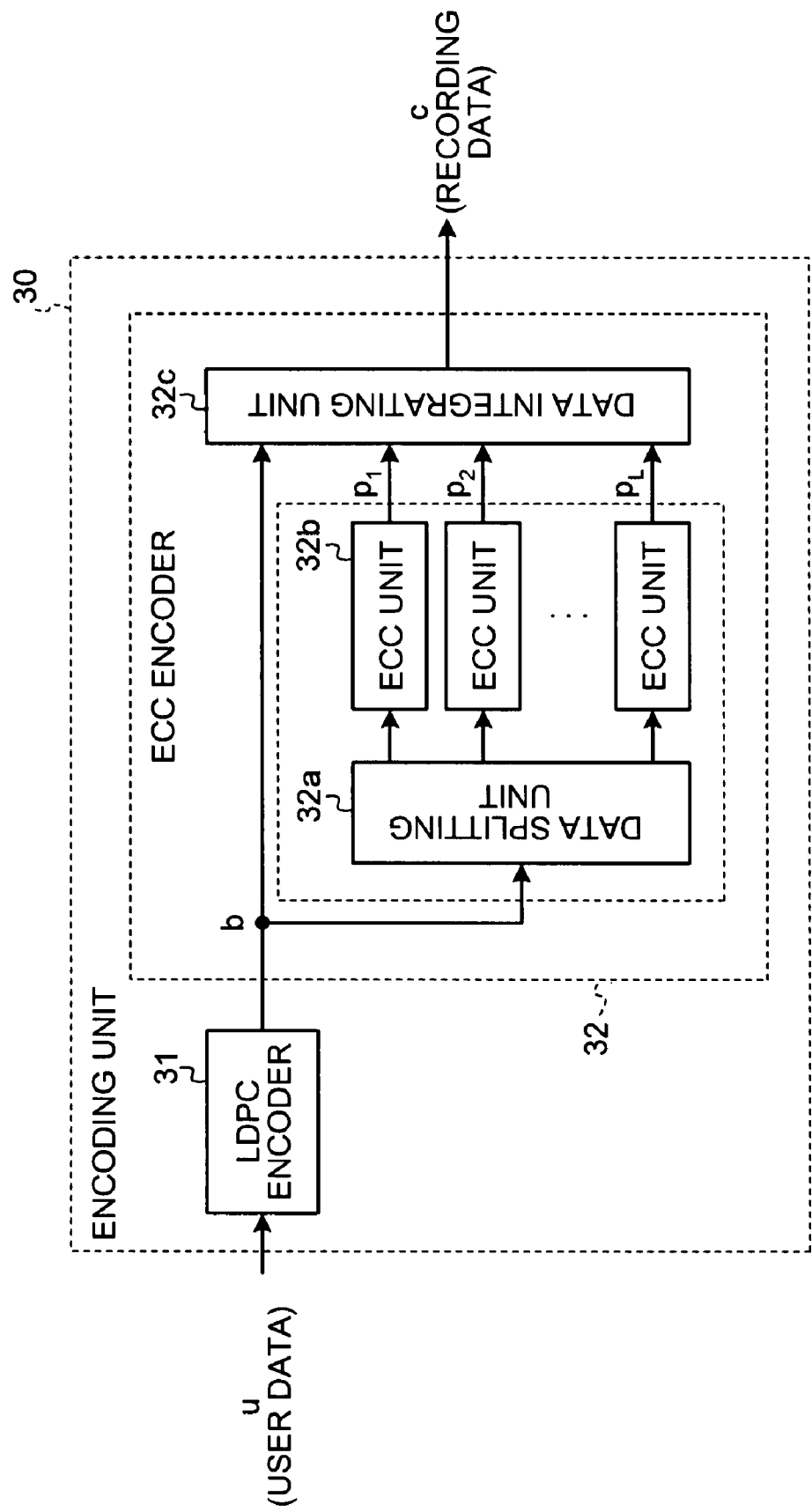
FIG. 4 is a block diagram of an encoding unit shown in FIG. 3.

The encoding unit 30 carries out encoding of the user data u. To be specific, as shown in FIG. 4, the encoding unit 30 includes an LDPC encoder 31, and an ECC encoder 32.

The LDPC encoder 31 adds, to the user data u, the LDPC parity generated by using LDPC encoding for calculating validity and likelihood of each data constituting the user data u, and outputs resultant data b to the ECC encoder 32. A data splitting unit 32a of the ECC encoder 32 splits the data b received from the LDPC encoder 31 into L data blocks. Next, ECC units 32b of the ECC encoder 32 outputs, to a data integrating unit 32c, ECC parities $p_1$ to $p_L$ generated by using ECC encoding for checking the validity of data in each data block (detect data errors) and correcting the data blocks to be valid within the correctable range. The data integrating unit 32c integrates the data b received from the LDPC encoder 31 with the ECC parities $p_1$ to $p_L$ received from the ECC encoder 32 and outputs resultant data c to the PR channel 40.

Incidentally, when splitting the data b received from the LDPC encoder 31, the data splitting unit 32a herein splits the data b into L data blocks having a fixed length from the head of the data b. However, data can also be collected from a pseudo random position and split into L data blocks. Further, the data integrating unit 32c herein adds the ECC parities $p_1$ to $p_L$ at the end of the data b received from the LDPC encoder 31. However, the ECC parities $p_1$ to $p_L$ can also be distributed over the data b.

The PR channel 40 writes the data c received from the LDPC encoder 31 to the disk 9 using the head 8. The PR channel 40 reproduces data c on the disk 9 using the head 8, and equalizes the magnetic recording reproduction waveform of the reproduced data (signals) y to the desired PR waveform using the equalizer (EQ), and outputs the reproduced data y to the channel APP decoder 50.

The channel APP decoder 50 decodes the reproduced data (signals) y received from the PR channel 40, calculates the likelihood L(c) (e.g., soft data that indicates, for each data represented by 0, 1 or a combination of 0 and 1, possibility as to whether the data is represented by 0 or 1) of each data constituting the reproduced data y, and outputs the likelihood L(c) to the decoding unit 60.

Figure 5:
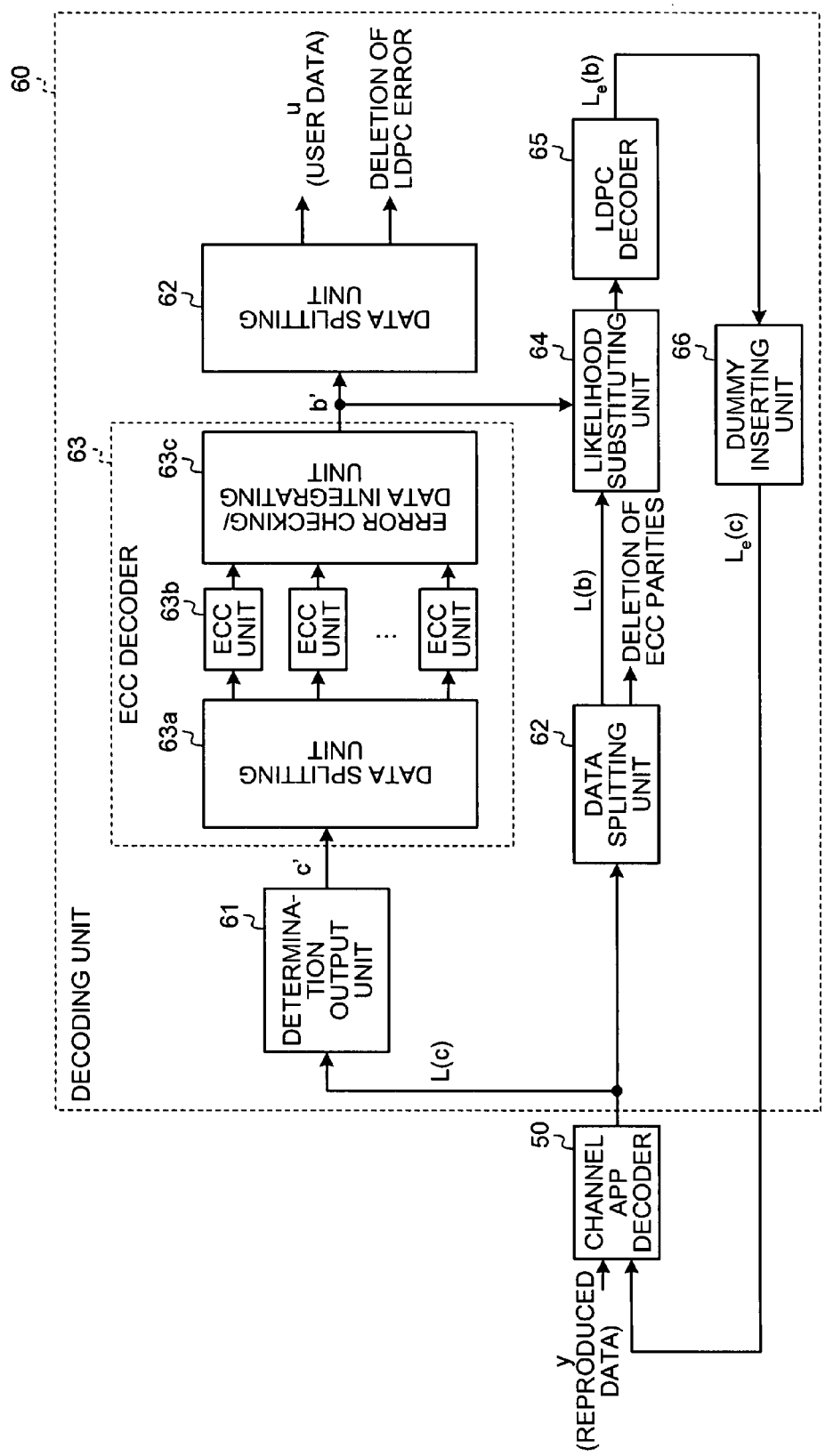
FIG. 5 is a block diagram of a decoding unit shown in FIG. 3.

The decoding unit 60 carries out decoding of the likelihood L(c) received from the channel APP decoder 50. To be specific, as shown in FIG. 5, the decoding unit 60 includes a determination output unit 61, data splitting units 62, an ECC decoder 63, a likelihood substituting unit 64, an LDPC decoder 65, and a dummy inserting unit 66.

The determination output unit 61 temporarily determines whether each data, which constitutes the likelihoods L(c) that are the soft data received from the channel APP decoder 50, is 0 or 1. According to the determination result, the determination output unit 61 converts the likelihoods L(c) into the binary data c' and outputs the binary data c' to the ECC decoder 63.

One of the data splitting units 62 deletes the ECC parities from the likelihoods L(c) and outputs the likelihoods L(b) before the likelihoods L(c) output from the channel APP decoder 50 are input to the LDPC decoder 65. The other of the data splitting units 62 deletes the LDPC parity from the data b' output from the ECC decoder 63.

The ECC decoder 63 decodes the binary data c' received from the determination output unit 61. Specifically, a data splitting unit 63a of the ECC decoder 63 splits the binary data c' received from the determination output unit 61 into L data blocks, and sends the data to ECC units 63b corresponding the data blocks, respectively. The ECC units 63b correct errors in the data from the data splitting unit 63a by using ECC parities within the correctable range. Then, the ECC units 63b removes the ECC parities from the data, and outputs the data to an error checking/data integrating unit 63c. The error checking/data integrating unit 63c determines whether any error is left uncorrected with respect to each data block. If there is no error, the error checking/data integrating unit 63c outputs data b' obtained by integrating the data of the data blocks to the data splitting unit 62. The data splitting unit 62 outputs the user data u obtained by removing the LDPC parity from the data b' received from the ECC decoder 63 to outside. If there is any data block in which an error remains, the error checking/data integrating unit 63c outputs data of each data block that has been corrected to be valid to the likelihood substituting unit 64.

Having received the data that has been corrected to be valid from the ECC decoder 63, the likelihood substituting unit 64 substitutes the maximum value for the likelihood L(b) (the likelihood L(b) is obtained when the data splitting unit 62 deletes the ECC parities from the likelihood L(c)) corresponding to data of each data block corrected to be valid, and outputs the user data to the LDPC decoder 65.

The LDPC decoder 65 uses the LDPC parity to decode the user data with the likelihoods partly substituted by the maximum value (belief propagation decoding), and calculates the likelihood of each data constituting the user data (recalculates, for each data, possibility as to whether the data is represented by 0 or 1). Next, the LDPC decoder 65 outputs, via the dummy inserting unit 66, the calculated likelihood of each data as the external data $L_e(b)$ to the channel APP decoder 50.

The dummy inserting unit 66 inserts the dummy likelihoods instead of the ECC parities in the external data $L_e(b)$ received from the LDPC decoder 65 and outputs the resultant data $L_e(c)$ to the channel APP decoder 50.

During redecoding of the reproduced data y and calculating the likelihood L(c) of each data constituting the reproduced data y, the channel APP decoder 50 uses as the prior data, the external data $L_e(c)$ received from the LDPC decoder 65 via the dummy inserting unit 66. The channel APP decoder 50 outputs the likelihoods L(c) calculated by decoding the reproduced data y to the ECC decoder 63 and the likelihood substituting unit 64. Thus, the decoding process of the likelihoods L(c) is repeated between the channel APP decoder 50 and the LDPC decoder 65 and, after all the errors are corrected by the ECC decoder 63 or the LDPC decoder 65, the user data u is obtained.

Figure 6:
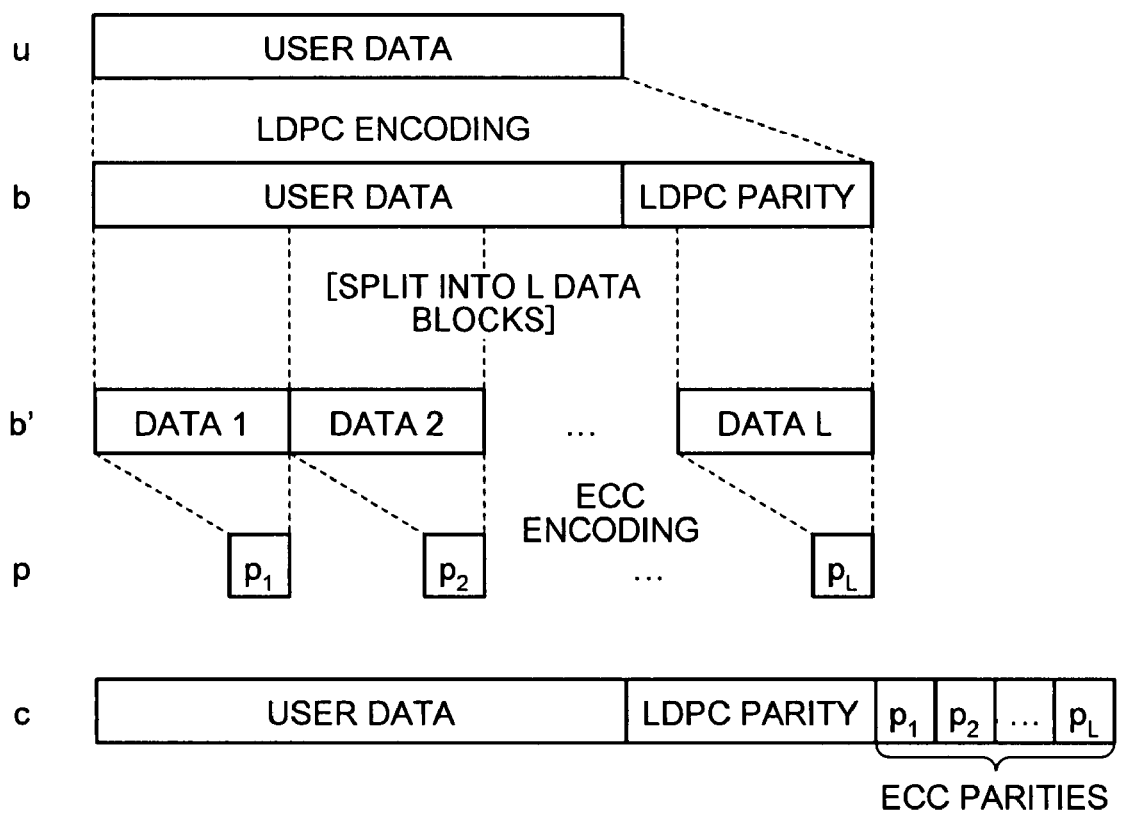
FIG. 6 is a schematic diagram for explaining an encoding data flow according to the first embodiment.

Next, a flow of data encoding process performed by the magnetic disk device 1 is explained with reference to FIG. 6. First, the LDPC encoder 31 carries out encoding of the user data u by using LDPC encoding for calculating the validity and likelihood of each data constituting the user data u, adds the generated LDPC parity to the user data u and outputs the resultant data b to the ECC encoder 32.

The data splitting unit 32a of the ECC encoder 32 splits into L data blocks the data b received from the LDPC encoder 31. Next, the ECC units 32b output, to a data integrated unit 32c, ECC parties $p_1$ to $p_L$ generated by using ECC encoding for checking the validity of data in each data block (detect data errors) and correcting the data blocks to be valid within the correctable range.

Next, the data integrating unit 32c integrates the data b received from the LDPC encoder 31 with the ECC parities $p_1$ to $p_L$ received from the ECC units 32b to obtain the data c.

Figure 7:
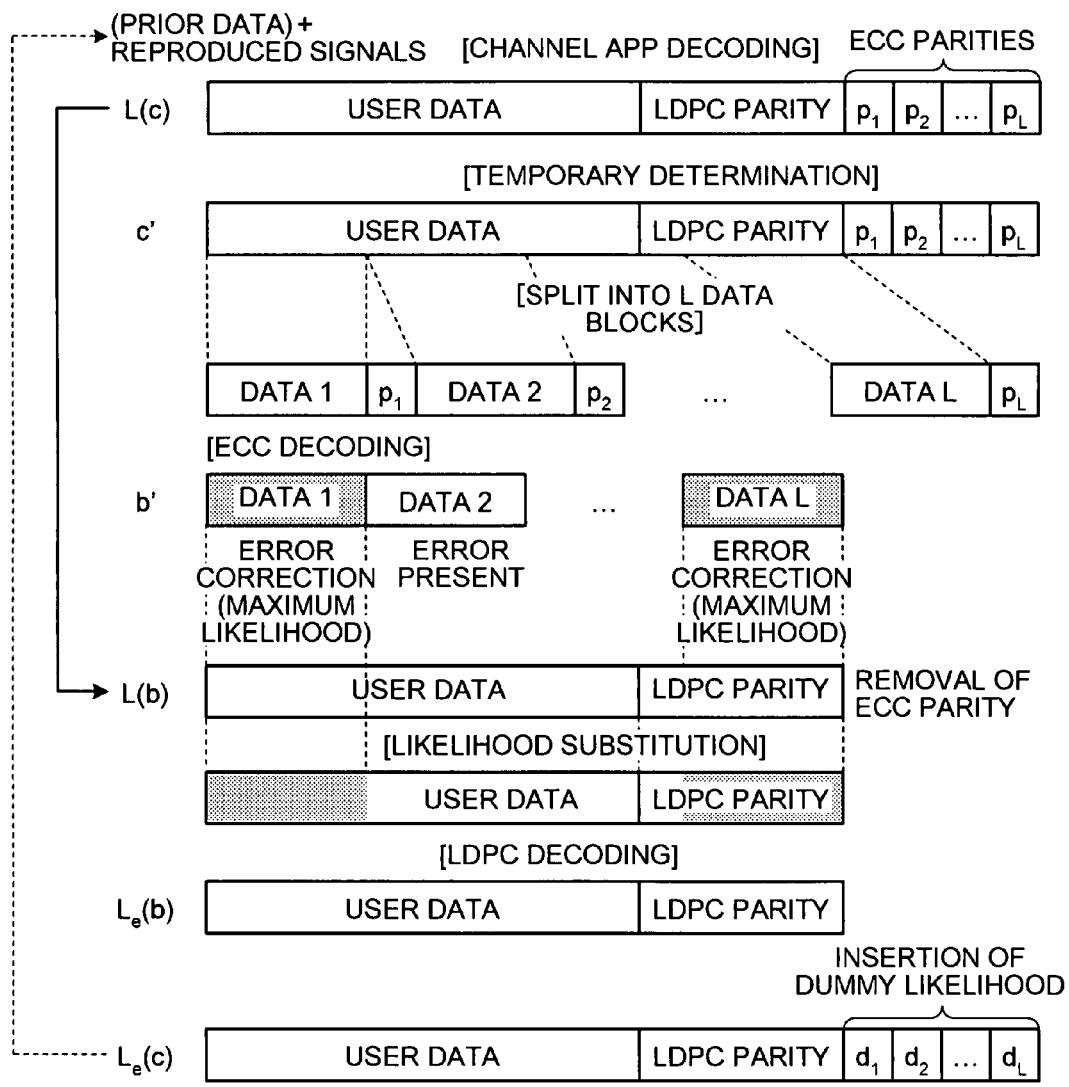
FIG. 7 is a schematic diagram for explaining a decoding data flow according to the first embodiment.

A flow of data decoding process performed by the magnetic disk device 1 is explained next with reference to FIG. 7. First, the determination output unit 61 temporarily determines whether each data, which constitutes the likelihoods L(c) that are the soft data received from the channel APP decoder 50, is 0 or 1. According to the determination result, the determination output unit 61 converts the likelihoods L(c) into the binary data c' and outputs the binary data c' to the ECC decoder 63.

The ECC decoder 63 decodes the binary data c' received from the determination output unit 61. Specifically, the data splitting unit 63a splits the binary data c' received from the determination output unit 61 into L data blocks, and sends the data to the ECC units 63b corresponding the data blocks, respectively. The ECC units 63b correct errors in the data from the data splitting unit 63a by using ECC parities within the correctable range. Then, the ECC units 63b removes the ECC parities from the data, and outputs the data to the error checking/data integrating unit 63c. The error checking/data integrating unit 63c determines whether any error is left uncorrected with respect to each data block. If there is no error, the error checking/data integrating unit 63c outputs data b' obtained by integrating the data of the data blocks to the data splitting unit 62. The data splitting unit 62 outputs the user data u obtained by removing the LDPC parity from the data b' received from the ECC decoder 63 to outside. If there is any data block in which an error remains, the error checking/data integrating unit 63c outputs data of each data block that has been corrected to be valid to the likelihood substituting unit 64.

Having received the data that has been corrected to be valid from the ECC decoder 63, the likelihood substituting unit 64 substitutes the maximum value for the likelihood L(b) (the likelihood L(b) is obtained when the data splitting unit 62 deletes the ECC parities from the likelihood L(c)) corresponding to data of each data block corrected to be valid, and outputs the user data to the LDPC decoder 65.

The LDPC decoder 65 uses the LDPC parity to decode the user data from the likelihood substituting unit 64 with the likelihood substituted by the maximum value (belief propagation decoding), and calculates the likelihood of each data constituting the user data (recalculates, for each data, the possibility as to whether the data is represented by 0 or 1). Next, the LDPC decoder 65 outputs, via the dummy inserting unit 66, the calculated likelihood of each data as the external data $L_e(b)$ to the channel APP decoder 50.

The dummy inserting unit 66 adds the dummy likelihoods (e.g., $d_1$ to $d_L$) instead of the ECC parities to the external data $L_e(b)$ received from the LDPC decoder 65, and outputs the resultant data $L_e(c)$ to the channel APP decoder 50.

When redecoding the reproduced data y to calculate the likelihood L(c) of each data constituting the reproduced data y, the channel APP decoder 50 uses as the prior data, the external data $L_e(c)$ received from the LDPC decoder 65.

As described above, according to the first embodiment, encoded data (LbPC parity) is generated using LDPC encoding for calculating the validity and likelihood of each data that constitutes the user data. The encoded data is added to the user data, and the obtained data is divided into data blocks. Then, the data is obtained which is added with encoded data (ECC parities) generated using ECC encoding for checking the validity of each data in each data block and correcting data to be valid within the correctable range. Consequently, for decoding each encoded data, validity information (information on the presence or absence of an error) can be obtained for use in correcting the burst errors that have occurred in the user data.

Moreover, reproduced data of data including the user data, the LDPC parity and the ECC parities is decoded to calculate the likelihood of each data that constitutes the data (e.g., the soft data on reliability that indicates, for each data represented by 0, 1 or a combination of 0 and 1, possibility as to whether the data is represented by 0 or 1). The data including the user data and the LDPC parity is divided into data blocks, and decoded using the ECC parities. The likelihood of data of each data block corrected to be valid is reset to the maximum value (e.g., the degree of reliability that indicates, for each data represented by 0, 1 or a combination of 0 and 1, possibility as to whether the data is represented by 0 or 1 is reset to the maximum value). The user data with the likelihood reset to the maximum value is decoded using the LDPC parity to calculate the likelihood of each data that constitutes the user data. Thus, the likelihood is set to the maximum value with respect to data of each data block corrected to be valid by the ECC parities, and used for decoding by the LDPC parity. Consequently, a consistency between decoding by the LDPC code or the turbo code and decoding by the RS code or the BCH code can be achieved (i.e., the soft data and the hard data are appropriately linked and used), and the burst errors can be corrected.

Furthermore, error correction of the reproduced data of the user data, substitution of the likelihood according to the error correction result, and decoding of the likelihood using a substitution result of the likelihood are repeated. Thus, iterative decoding of the likelihood can be performed while the likelihood of the data portion corrected to be valid is set, and the burst errors can be accurately corrected.

Repeated decoding of likelihood between the channel APP decoder 50 and the LDPC decoder 65 is explained in the first embodiment. The decoding of the likelihood can also be repeated a predetermined number of times by the LDPC decoder 65 until the likelihood of data of each data block of the user data is set to the maximum value, or until determination result (determination result by LDPC parity check) of validity indicates valid for every data set.

Thus, apart from that it is possible to reduce the size of a circuit for implementing the processes, with characteristics of the decoding process (belief propagation decoding) using the LDPC parity, the likelihood of the user data can be efficiently calculated, which contributes to correction of the burst errors. Further, if the result of the LDPC parity check indicates that all the data is valid, the user data can be directly output from the device that performs the LDPC decoding.

The ECC decoder 63 uses ECC encoding for correcting data to be valid within the correctable range in the first embodiment. Cyclic redundancy check (CRC) encoding can also be used for determining validity of the data (detecting the data errors).

Figure 8:
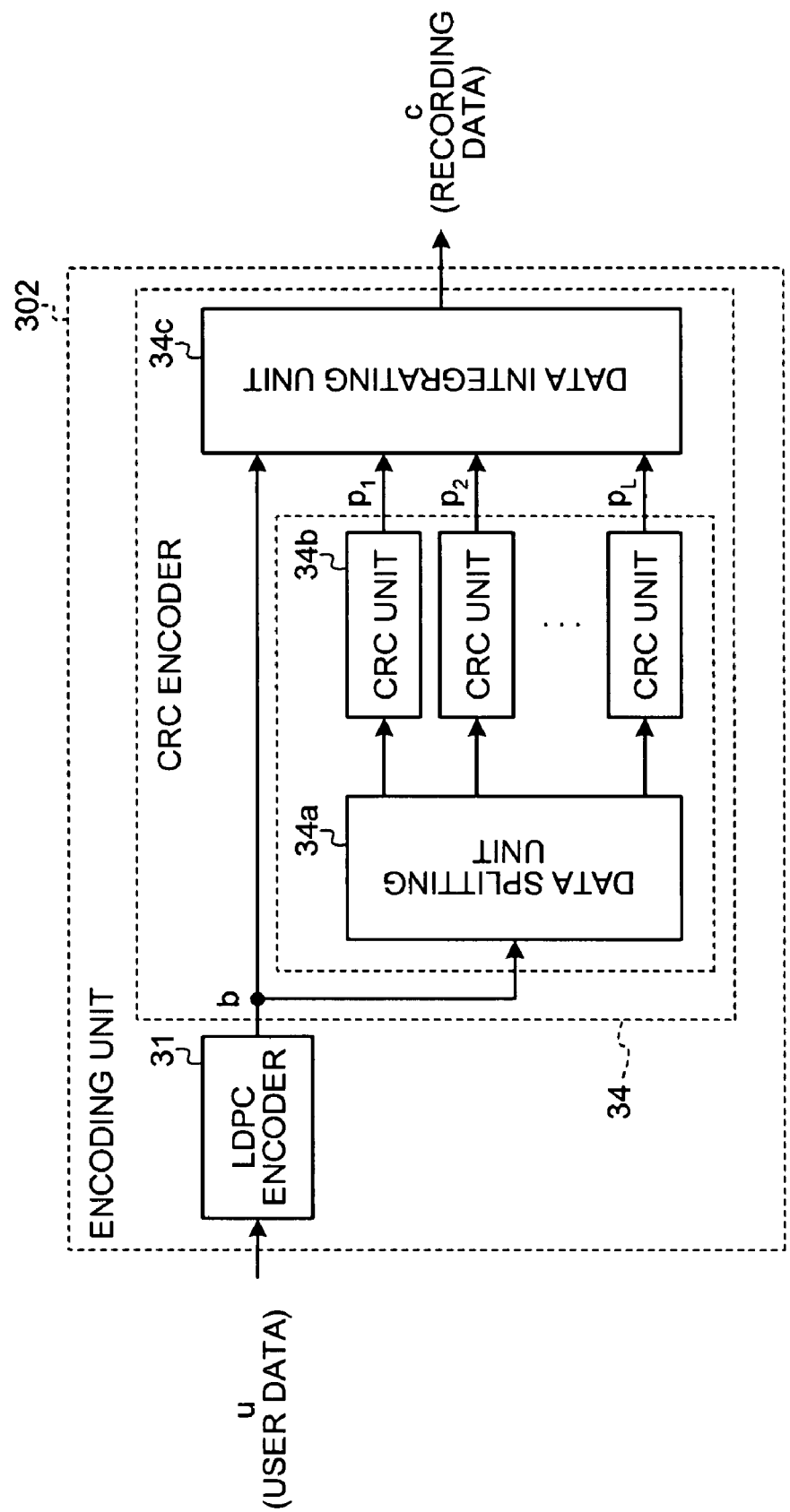
FIG. 8 is a block diagram of an encoding unit of a magnetic disk device according to a second embodiment of the present invention.

FIG. 8 is a block diagram of an encoding unit 302 according to a second embodiment of the present invention. The encoding unit 302 is basically similar in construction to the encoding unit 30, and different features are explained below.

The encoding unit 302 includes a CRC encoder 34. The CRC encoder 34 includes a data splitting unit 34a that splits the data b received from the LDPC encoder 31 into L data blocks. Next, CRC units 34b of the CRC encoder 34 use CRC encoding for checking the validity of data of each data block and output generated CRC parities $p_1$ to $p_L$ to a data integrating unit 34c.

Figure 9:
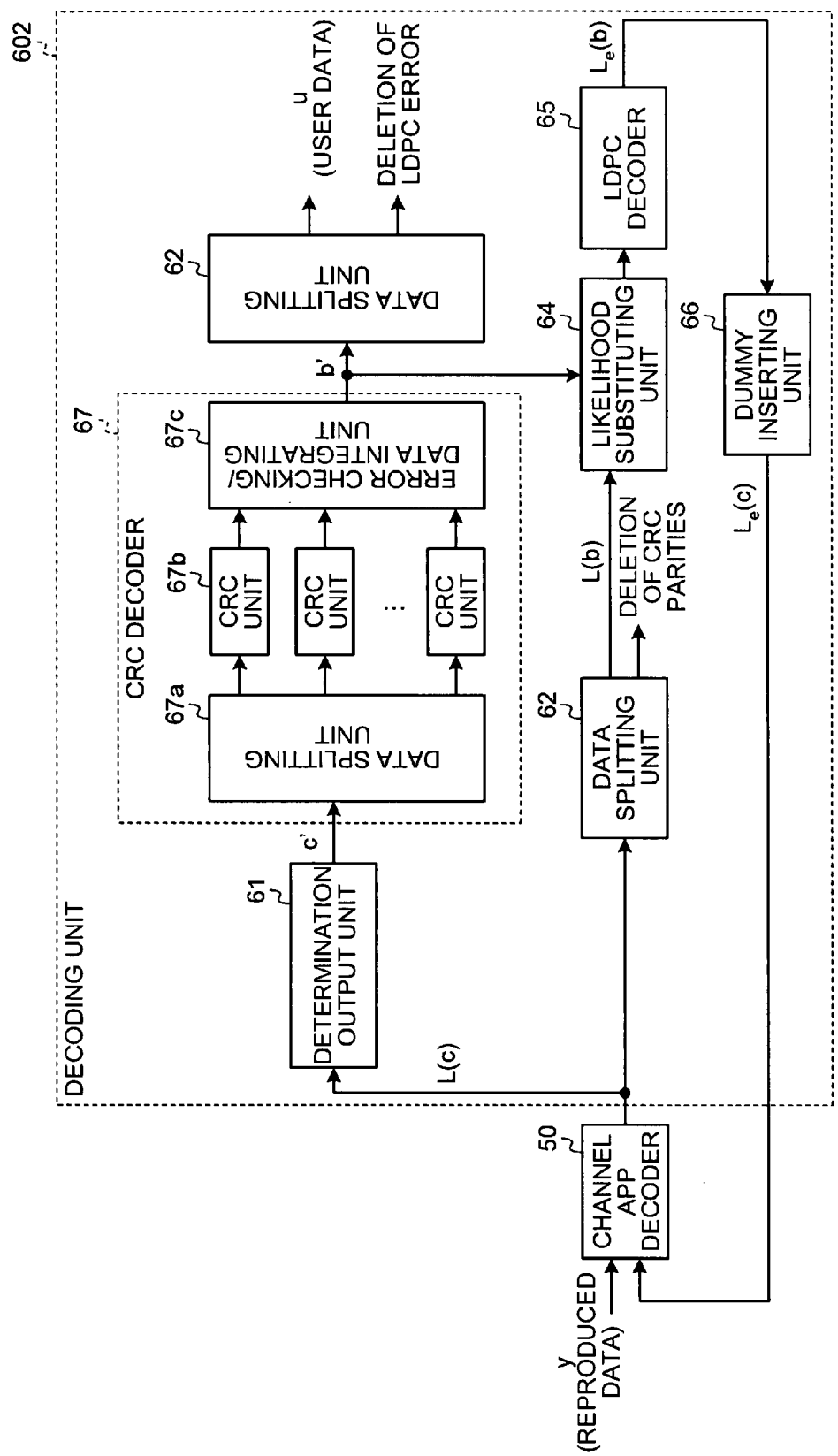
FIG. 9 is a block diagram of a decoding unit of a magnetic disk device according to a second embodiment of the present invention.

FIG. 9 is a block diagram of a decoding unit 602 according to the second embodiment. The decoding unit 602 is basically similar in construction to the decoding unit 60, and different features are explained below.

The decoding unit 602 includes a CRC decoder 67. The CRC decoder 67 decodes the binary data c' received from the determination output unit 61 using the CRC code. Specifically, a data splitting unit 67a of the CRC decoder 67 splits the binary data c' received from the determination output unit 61 into L data blocks, and sends the data to CRC units 67b corresponding the data blocks, respectively. The CRC units 67b checks the validity of the data from the data splitting unit 67a by using the CRC parities, and removes the CRC parities from the data to send them to an error checking/data integrating unit 67c. The error checking/data integrating unit 67c determines whether any error is left uncorrected with respect to each data block. If there is no error, the error checking/data integrating unit 67c outputs data b' obtained by integrating the data of the data blocks to the data splitting unit 62. The data splitting unit 62 outputs the user data u obtained by deleting the CRC parities from the data b' received from the CRC decoder 67 to outside. If there is any data block in which an error remains, the error checking/data integrating unit 67c outputs data of each data block in which no error has been detected to the likelihood substituting unit 64.

Having received the data in which no error has been detected from the CRC units 67b, the likelihood substituting unit 64 substitutes the maximum value for the likelihood L(b) (the likelihood L(b) is obtained when the data splitting unit 62 deletes the CRC parities from the likelihood L(c)) corresponding to data of each data block with no error, and outputs the user data to the LDPC decoder 65.

Apart from the CRC encoder 34 and the CRC decoder 67, the magnetic disk device according to the second embodiment is basically of the same construction and operates in the same manner as the magnetic disk device 1 according to the first embodiment.

As described above, according to the second embodiment, encoded data (LDPC parity) is generated using LDPC encoding for calculating the validity and likelihood of each data that constitutes the user data. The encoded data is added to the user data, and the obtained data is divided into data blocks. Data is obtained which is added with encoded data (CRC parities) generated using CRC encoding for determining validity of each data in the respective blocks. Due to this, for decoding each encoded data, the validity information (information on the presence or absence of an error) can be obtained that is used to correct the burst errors that have occurred in the user data.

Moreover, reproduced data of data including the user data, the LDPC parity and the CRC parities is decoded to calculate the likelihood of each data that constitutes the data (e.g., the soft data on reliability that indicates, for each data represented by 0, 1 or a combination of 0 and 1, possibility as to whether the data is represented by 0 or 1). The data including the user data and the LDPC parity is divided into data blocks, and decoded using the CRC parities. The likelihood of data of each data block that does not include errors is reset to the maximum value (e.g., the degree of reliability that indicates, for each data represented by 0, 1 or a combination of 0 and 1, possibility as to whether the data is represented by 0 or 1 is reset to the maximum value). The user data with the likelihood reset to the maximum value is decoded using the LDPC parity to calculate the likelihood of each data that constitutes the user data. Thus, the likelihood is set to the maximum value with respect to data of each data block that does not include errors by the CRC parities, and used for decoding by the LDPC parity. Consequently, a consistency between decoding by the LDPC code or the turbo code and decoding by the CRC code or the Humming code can be ensured (i.e., the soft data and the hard data are appropriately linked and used), and the burst errors can be corrected.

Moreover, error correction of the reproduced data of the user data, substitution of the likelihood according to the error correction result, and decoding of the likelihood using a substitution result of the likelihood are repeated. Thus, iterative decoding of the likelihood can be performed while the likelihood of the data portion having no error is set, and the burst errors can be accurately corrected.

Repeated decoding of likelihood between the channel APP decoder 50 and the LDPC decoder 65 is explained in the first embodiment. The decoding of the likelihood can also be repeated between the ECC decoder 63 and the LDPC decoder 65.

Figure 10:
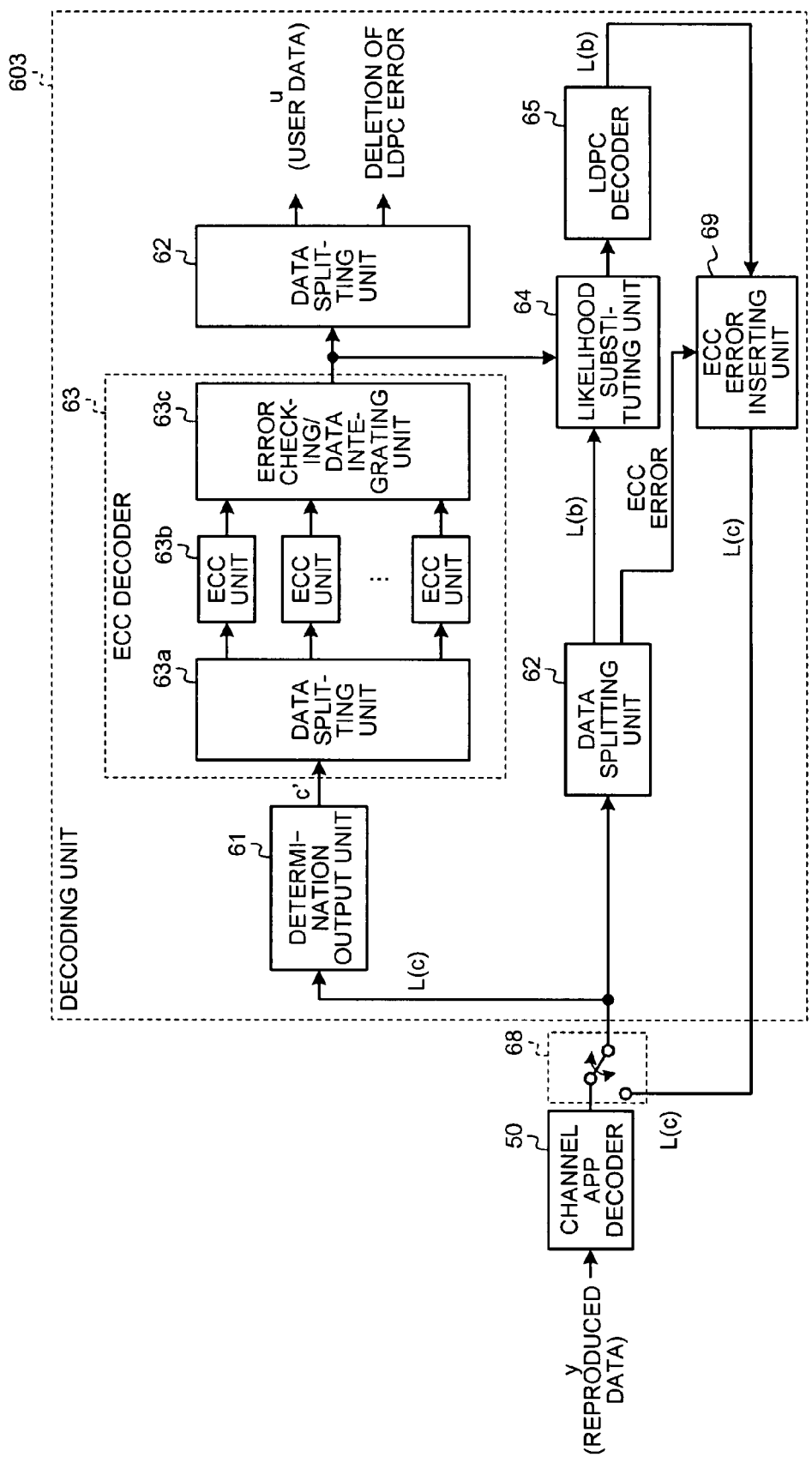
FIG. 10 is a block diagram of a decoding unit of a magnetic disk device according to a third embodiment of the present invention.

FIG. 10 is a block diagram of a decoding unit 603 according to a third embodiment of the present invention. The decoding unit 603 is basically similar in construction to the decoding unit 60, and different features are explained below.

The data splitting unit 62 splits the likelihood L(c) output from the channel APP decoder 50 into the likelihood L(b) and ECC parity likelihood. Having received the likelihood from the likelihood substituting unit 64, the LDPC decoder 65 outputs posterior probability likelihood L(b). An ECC parity inserting unit 69 inserts the ECC parity likelihood in the likelihood L(b), and outputs the likelihood L(c). After the first decoding process of the likelihoods between the channel APP decoder 50 and the LDPC decoder 65 is finished, a switch unit 68 is switched to terminate a connection to the channel APP decoder 50, and the decoding process of the likelihoods is repeatedly performed between the ECC decoder 63 and the LDPC decoder 65. The decoding process can be performed a predetermined number of times; the decoding process can also be performed until the likelihood of data of each data block of the user data is fixed to the maximum value, or until determination result (determination result by LDPC parity check) of validity indicates valid (i.e., until all errors are corrected) for every data set.

Apart from the switch unit 68, the magnetic disk device according to the third embodiment is basically of the same construction and operates in the same manner as the magnetic disk device 1 according to the first embodiment.

Thus, in addition to that it is possible to reduce the size of a circuit for implementing the decoding process of the likelihood, by appropriately linking and using the likelihood, i.e., the reliability which indicates, for each data represented by 0 or 1, possibility as to whether the data is represented by 0 or 1 (soft data) and binary data that has been identified as 0 or 1 (hard data), the burst errors can be efficiently corrected.

Repeated decoding of likelihoods between the channel APP decoder 50 and the LDPC decoder 65 is explained in the third embodiment. The decoding of the likelihoods can also be repeated between the CRC decoder 67 explained in the second embodiment that determines validity of the data (detects errors) and the LDPC decoder 65.

In the first embodiment, the magnetic disk device carries out LDPC encoding of the user data u, adds the generated LDPC parity to the user data u, splits the resultant data b into L data blocks, carries out ECC encoding of data of each data block, adds the resultant ECC parities to the data b to obtain the data c, and carries out the decoding process on the data c. However, the decoding process can also be performed on the data generated by LDPC encoding after ECC encoding.

Figure 11:
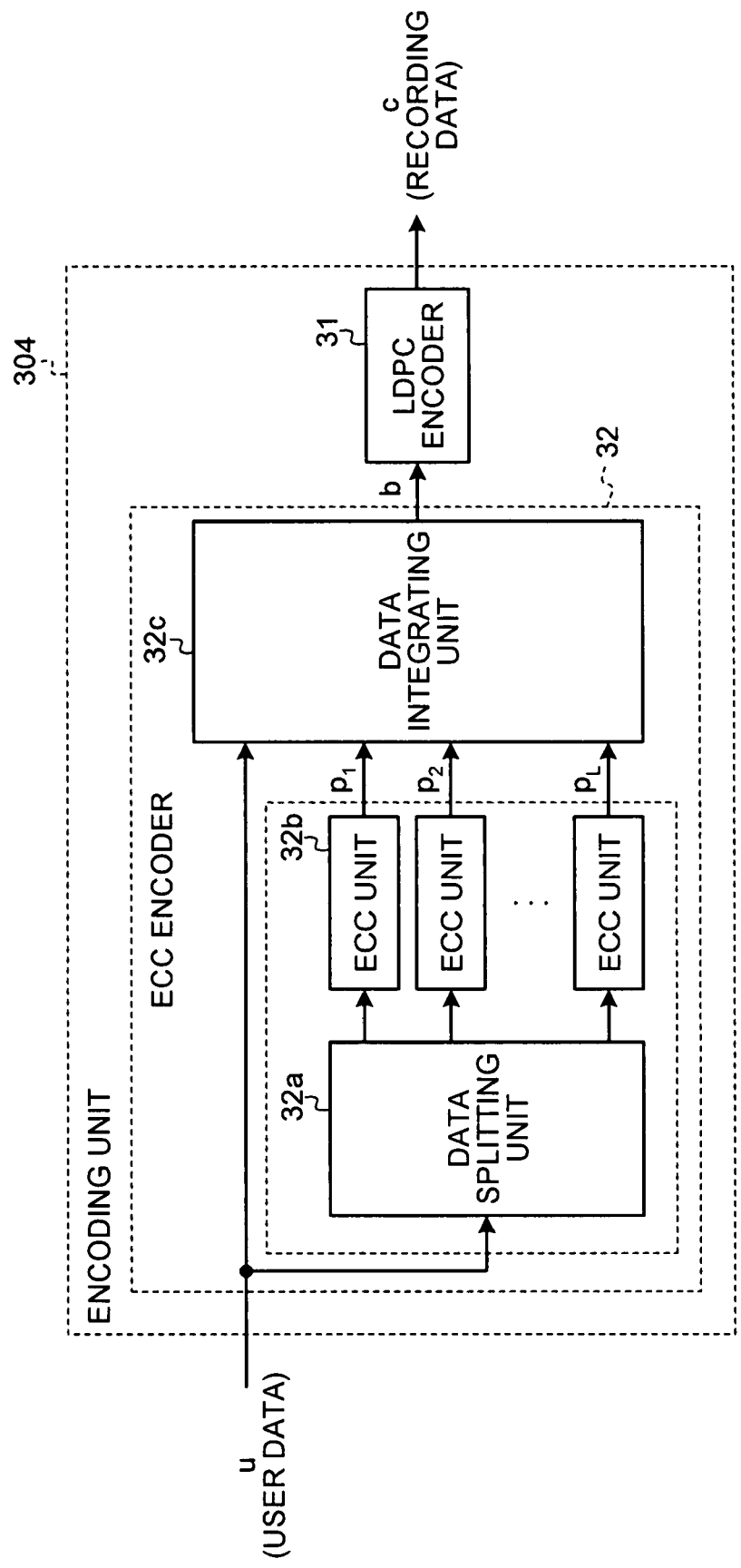
FIG. 11 is a block diagram of an encoding unit of a magnetic disk device according to a fourth embodiment of the present invention.

FIG. 11 is a block diagram of an encoding unit 304 according to a fourth embodiment of the present invention. The encoding unit 304 is basically similar in construction to the encoding unit 30. However, a sequence of process inside the circuit differs as is explained below.

First, the data splitting unit 32a of the ECC encoder 32 splits the user data u into L data blocks. The ECC units 32b generate the ECC parties $p_1$ to $p_L$ through ECC encoding for checking the validity of data in each data block (detect data errors) and correcting the data to be valid within the correctable range.

Next, the data integrating unit 32c integrates the user data u with the ECC parities $p_1$ to $p_L$ received from the ECC units 32b, and outputs the resultant data b to the LDPC encoder 31.

The LDPC encoder 31 carries out LDPC encoding on the data b for calculating the likelihood of each data constituting the user data u, adds the generated LDPC parity to the data b, and outputs the resultant data c to the PR channel 40.

Figure 12:
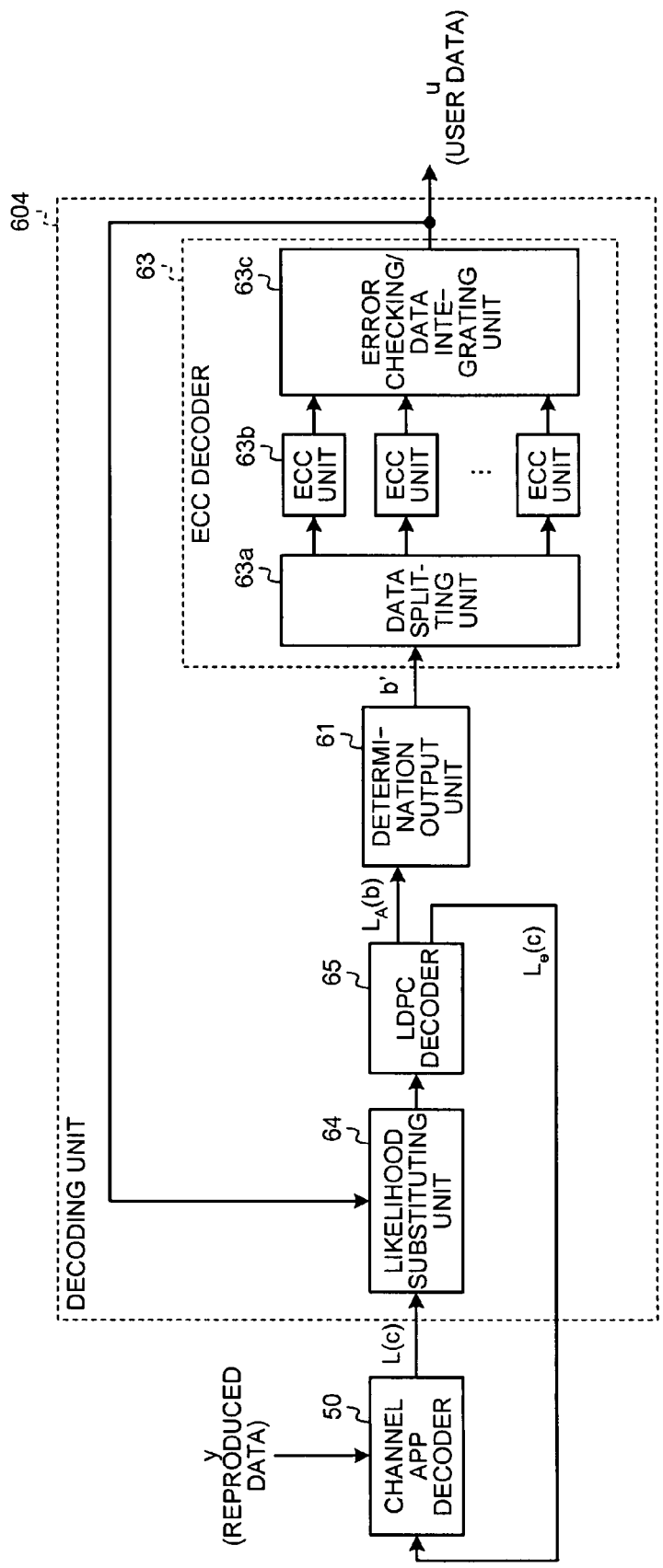
FIG. 12 is a block diagram of a decoding unit of the magnetic disk device according to the fourth embodiment.

FIG. 12 is a block diagram of a decoding unit 604 according to the fourth embodiment. The decoding unit 604 is basically similar in construction to the decoding unit 60. However, a sequence of process inside the circuit differs as is explained below.

After the channel APP decoder 50 decodes the reproduced data y and the initial likelihoods are input to the LDPC decoder 65 via the likelihood substituting unit 64, the LDPC decoder 65 decodes the initial likelihoods L(c) by using the LDPC parity, and outputs decoded data $L_A(b)$ to the determination output unit 61. The determination output unit 61 converts the decoded data $L_A(b)$ received from the LDPC decoder 65 into the data b', and outputs the data b' to the ECC decoder 63.

The ECC decoder 63 decodes the data b' received from the determination output unit 61. Specifically, the data splitting unit 63a splits the data b' received from the determination output unit 61 into L data blocks, and sends the data to the ECC units 63b corresponding the data blocks, respectively. The ECC units 63b correct errors in the data from the data splitting unit 63a by using ECC parities within the correctable range. Then, the ECC units 63b removes the ECC parities from the data, and outputs the data to the error checking/data integrating unit 63c. The error checking/data integrating unit 63c determines whether any error is left uncorrected with respect to each data block. If there is no error, the error checking/data integrating unit 63c outputs user data u to each unit. If there is any data block in which an error remains, the error checking/data integrating unit 63c outputs data of each data block that has been corrected to be valid to the likelihood substituting unit 64.

Having received the data that has been corrected to be valid the ECC decoder 63, the likelihood substituting unit 64 substitutes the maximum value for the likelihood L(c) corresponding to data of each data block corrected to be valid, and outputs the user data to the LDPC decoder 65. The LDPC decoder 65 uses the LDPC parity to decode the user data from the likelihood substituting unit 64 with the likelihood substituted by the maximum value (belief propagation decoding), and calculates the likelihood of each data constituting the user data. The LDPC decoder 65 outputs the calculated likelihood of each data to the channel APP decoder 50 as the external data $L_e(c)$.

As described above, according to the fourth embodiment, error correction of the reproduced data of the user data, substitution of the likelihood according to the error correction result, and decoding of the likelihood by using a substitution result of the likelihood are repeated. Due to this, when the ECC parities is generated from the user data, the LDPC parity is generated from the data including the ECC parities and the user data, and the likelihood of the data including the user data, the ECC parities, and the LDPC parity is decoded, for example, if the likelihood of the data corrected to be valid by the ECC parities can be set, iterative decoding of the likelihood can be performed. Thus, the burst errors can be corrected.

The encoding unit and the decoding unit applied to the magnetic disk device in the aforementioned embodiments can be similarly applied to storage products such as an optical disk, and can also be applied to digital signal processing in the field of communication on a wireless local area network (LAN), the wireless Internet, and long distance optical communication, and the like.

Instead of the LDPC code, which is applied to the encoding unit and the decoding unit of the magnetic disk device in the aforementioned embodiments, the turbo code having similar functions can also be used.

In the first embodiment, the magnetic disk device carries out LDPC encoding of the user data u, adds the generated LDPC parity to the user data u, splits the resultant data b into L data blocks, carries out ECC encoding of data of each data block, adds the resultant ECC parities to the data b to obtain the data c, and carries out the decoding process on the data c. However, in the LDPC encoding, the user data u can be split into M data blocks, and LDPC encoding of data of each data block can be carried out to obtain LDPC parity. In this case, the LDPC parity is added to the user data u to obtain the data b, and the data b is split into L data blocks. ECC encoding of data of each data block is carried out to obtain ECC parity to be added to the data b to obtain the data c.

Figure 13:
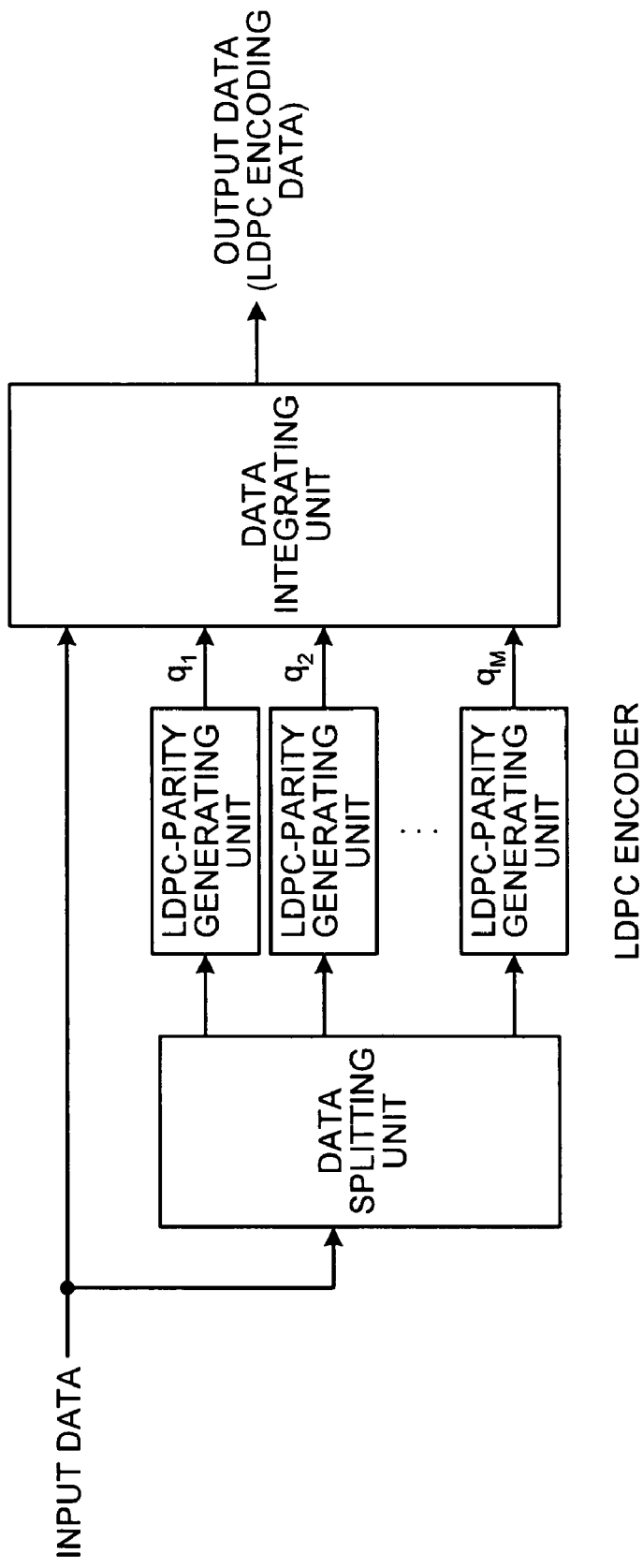
FIG. 13 is a block diagram of an LDPC encoder of a magnetic disk device according to a fifth embodiment of the present invention.
Figure 14:
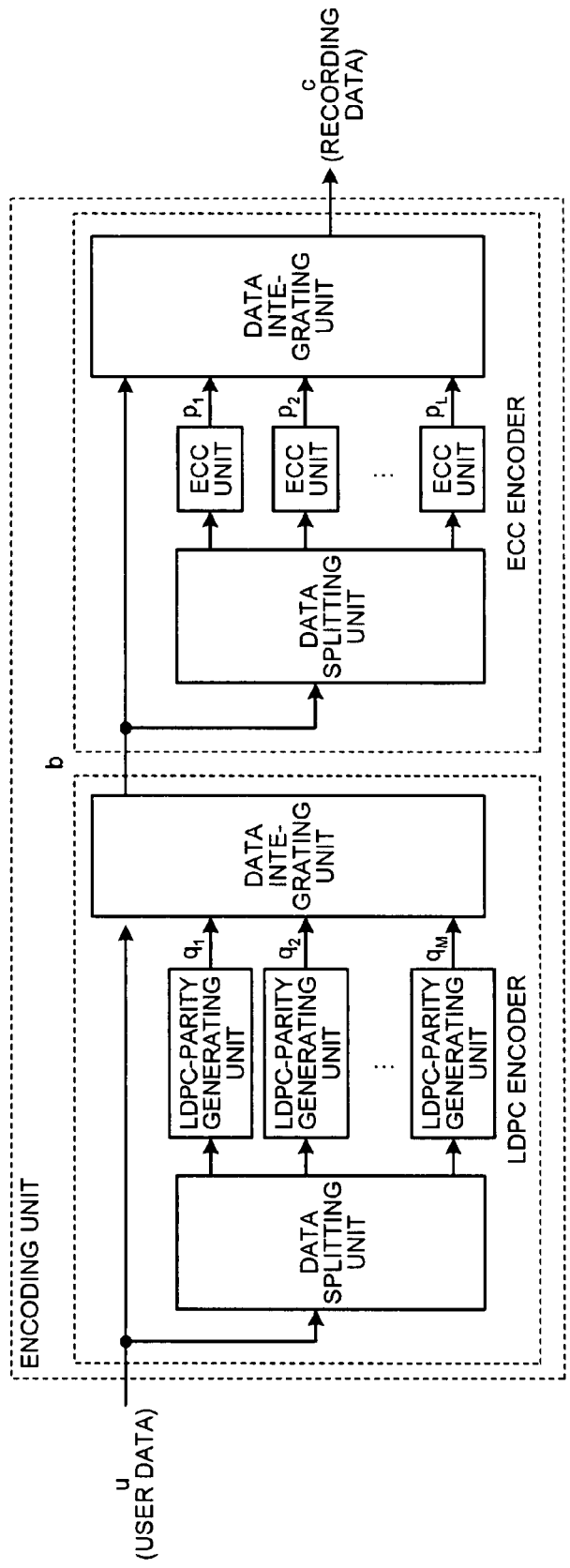
FIG. 14 is a block diagram of an encoding unit of the magnetic disk device according to the fifth embodiment.

FIG. 13 is a block diagram of an LDPC encoder of a magnetic disk device according to a fifth embodiment of the present invention. FIG. 14 is a block diagram of an encoding unit of the magnetic disk device according to the fifth embodiment. The encoding unit of the fifth embodiment is basically similar in construction to the encoding unit 30 except for the LDPC encoder, and that a sequence of process inside the circuit differs as is explained below.

As shown in FIG. 14, the data splitting unit of the LDPC encoder splits the user data u into M data blocks. The LDPC-parity generating units generates the LDPC parties $q_1$ to $q_M$ through LDPC encoding for checking the validity of data in each data block (detect data errors) and calculating the likelihood, and output them to the data integrating unit. The data integrating unit integrates the user data u with the LDPC parities $q_1$ to $q_M$ received from the LDPC-parity generating units, and outputs the resultant data b (LDPC-encoded data) to the ECC encoder.

The data splitting unit of the ECC encoder splits the data b into L data blocks. The ECC units generating the ECC parties $q_1$ to $q_L$ through ECC encoding for checking the validity of data in each data block (detect data errors) and correcting the data to be valid within the correctable range. The data integrating unit integrates the data b with the ECC parities $p_1$ to $p_L$ received from the ECC units, and outputs the resultant data c (recorded data) to the PR channel.

Figure 15:
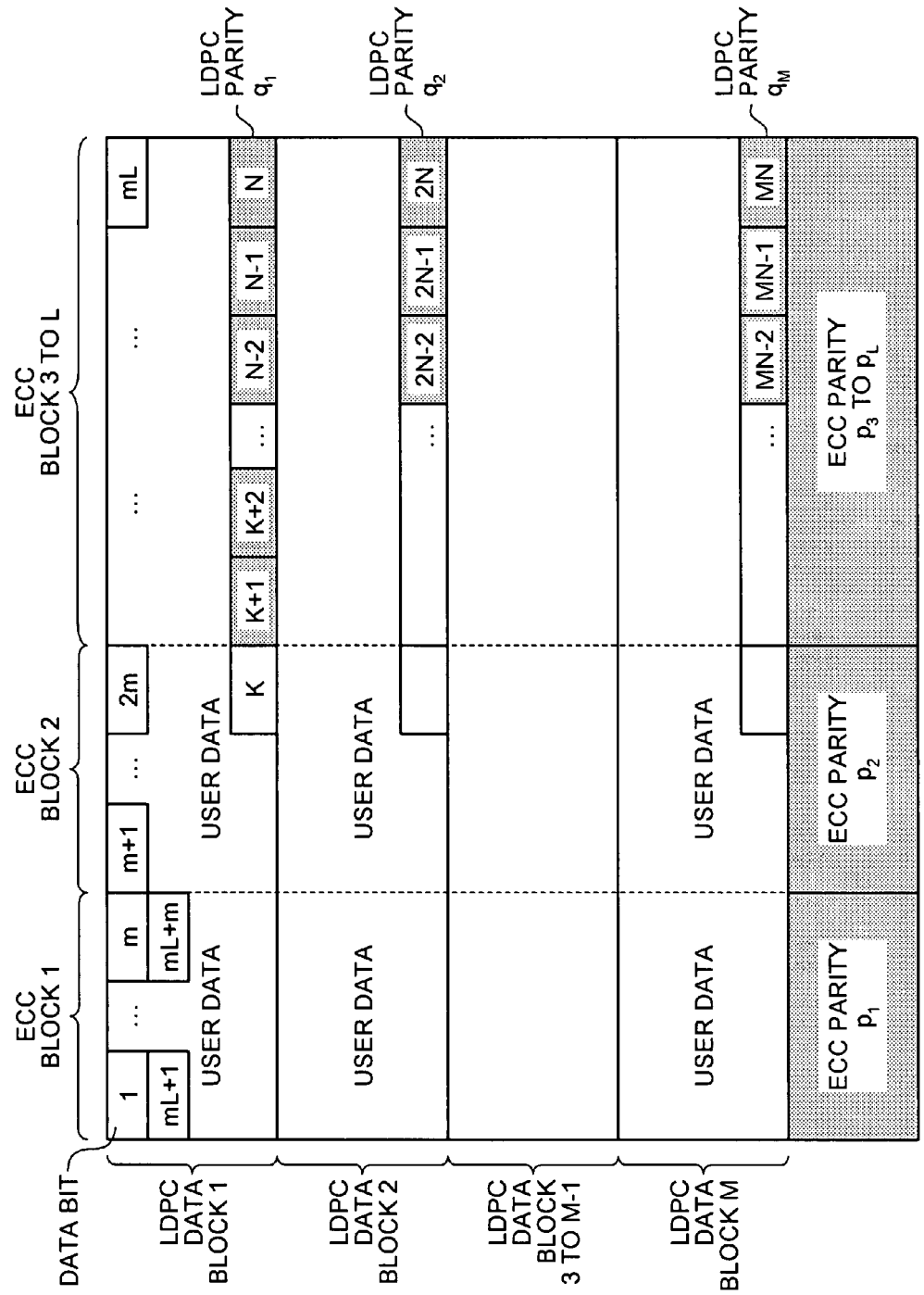
FIG. 15 is an example of data structure according to the fifth embodiment.

FIG. 15 is an example of structure of data (data c) generated by the encoders according to the fifth embodiment. Data generated by the encoders has an integrated code structure in which LDPC blocks and ECC blocks include horizontal parities and vertical parities, respectively. The integrated code structure is explained below based on the encoding sequence.

First, the data splitting unit of the LDPC encoder splits the user data u into M data blocks by K bits in order of data bit 1, 2, 3 . . . The LDPC-parity generating units generates LDPC parities $q_1$ to $q_M$ with K bits as a single data block. The data integrating unit integrates the user data u with the LDPC parities $q_1$ to $q_M$ to obtain the data b, and outputs the data b (LDPC-encoded data) having the LDPC parities $q_1$ to $q_M$ each added to each K-bit data block to the ECC encoder. The data b is output in a sequence of data bits 1, 2, 3, . . . , N, . . . , 2 N, . . . , and MN.

The data splitting unit of the ECC encoder splits the data b received from the LDPC encoder into L data blocks by m bits, and sends them to the ECC units. For example, a data block for generating ECC parity $p_1$ includes a sequence of data bits 1 to m, mL+1 to mL+m, . . . Here, "m" is a length determined by Galois field GF ($2^m$) used when the ECC units use, for example, RS codes. The data integrating unit integrates the data b with the LDPC parities $p_1$ to $p_L$ generated by the ECC units. Thus, the data c can be obtained that has the integrated code structure in which LDPC blocks and ECC blocks include horizontal parities and vertical parities, respectively.

Although the integrated code structure is explained above as having LDPC blocks and ECC blocks including horizontal parities and vertical parities, respectively, arrangement of the parities can be switched. That is, data can be split and integrated by the data splitting units and the data integrating units such that LDPC blocks and ECC blocks include vertical parities and horizontal parities, respectively.

Figure 16:
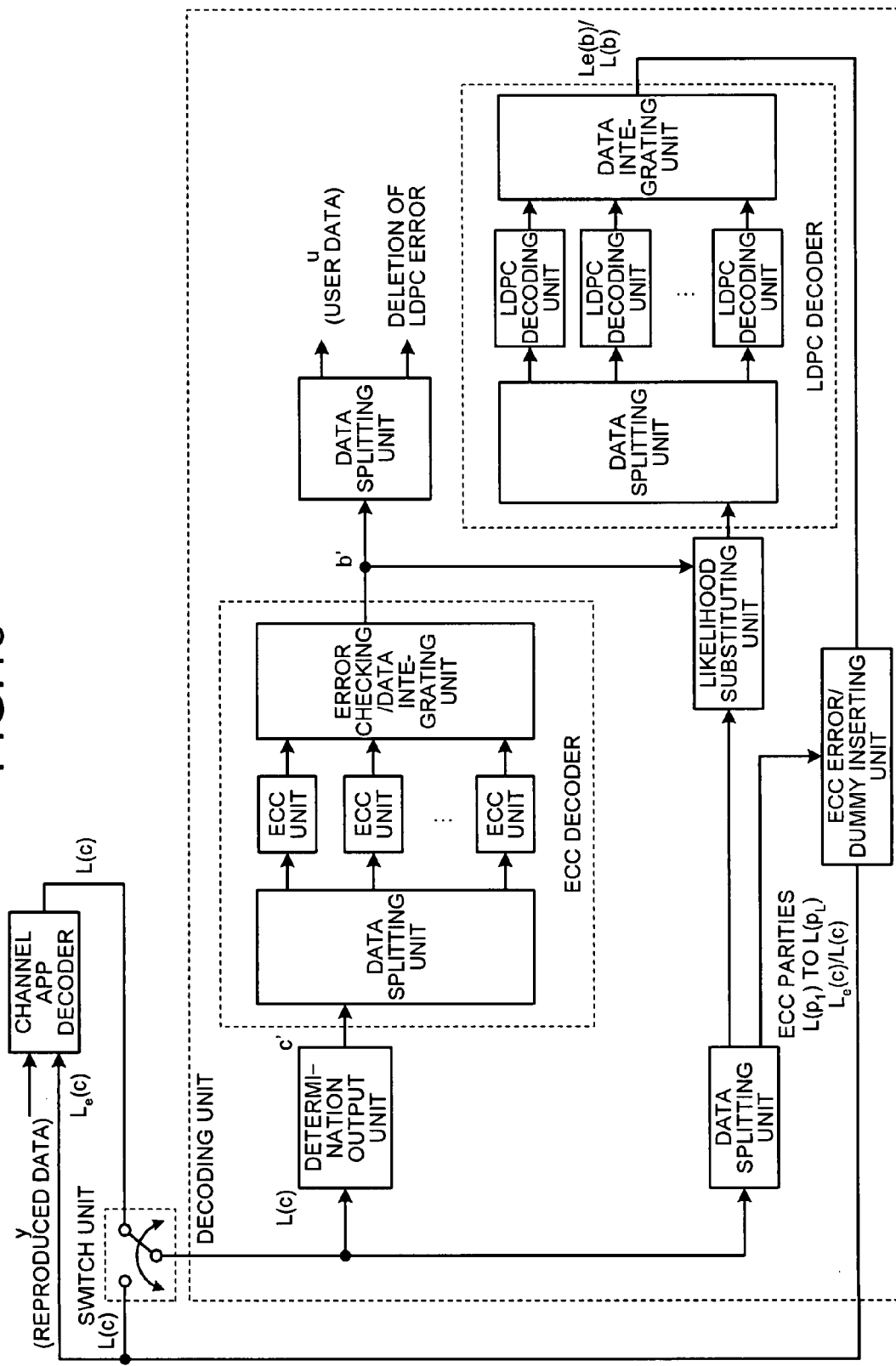
FIG. 16 is a block diagram of a decoding unit of the magnetic disk device according to the fifth embodiment.

FIG. 16 is a block diagram of a decoding unit of the magnetic disk device according to the fifth embodiment. The decoding unit of the fifth embodiment is basically similar in construction to the decoding unit 60 except that a sequence of process inside the circuit differs as is explained below.

The data splitting unit of the LDPC decoder splits data received from the likelihood substituting unit into, for example, M data blocks. LDPC decoding units decode the data with likelihoods partly substituted by the maximum value using LDPC parities (belief propagation decoding), and output likelihood (external data or posterior probability likelihood) of each data to the data integrating unit. When outputting the likelihood of each data to the channel APP decoder, the LDPC decoder outputs it to an ECC parity/dummy inserting unit as the external data $L_e(b)$. On the other hand, when repeatedly performing the decoding process of the likelihoods with the ECC decoder, the LDPC decoder controls the switch unit to terminate the connection to the channel APP decoder, and outputs the likelihood of each data to the ECC parity/dummy inserting unit as the posterior probability likelihood $L(b)$. The switching operation of the switch unit is performed without any delay according to the decoding process.

Upon receiving the external data $L_e(b)$ from the LDPC decoder, the ECC parity/dummy inserting unit adds dummy likelihoods instead of ECC parities to the external data $L_e(b)$, and outputs the external data $L_e(c)$ to the channel APP decoder. Upon receiving the posterior probability likelihood $L(b)$ from the LDPC decoder, the ECC parity/dummy inserting unit outputs the likelihood $L(c)$ added with ECC parities to the ECC decoder.

Otherwise, the magnetic disk device according to the fifth embodiment is of the same construction and operates in the same manner as the magnetic disk devices of the embodiments previously described.

As described above, according to the fifth embodiment, an LDPC data block is split into a plurality of blocks, and therefore, effect of burst errors can be concentrated in a single block. Moreover, by appropriately linking and using the likelihood, i.e., the reliability which indicates, for each data represented by 0 or 1, possibility as to whether the data is represented by 0 or 1 (soft data) and binary data that has been identified as 0 or 1 (hard data), the burst errors can be efficiently corrected.

Repeated decoding of likelihoods between the ECC decoder and the LDPC decoder is explained in the fifth embodiment. The decoding of the likelihoods can also be repeated between the CRC decoder explained in the second embodiment that determines validity of the data (detects errors) and the LDPC decoder.

In the fifth embodiment, the user data u is split into M data blocks, and data of the respective data blocks are LDPC-encoded to obtain LDPC parities. The LDPC parities are added to the user data u to generate the data b. The data b is further split into L data blocks, and data of the respective data blocks are ECC-encoded to obtain ECC parities. The ECC parities are added to the data b to generate the data c, and the decoding process is performed on the data c. However, the data can be ECC-encoded first, and then LDPC-encoded.

Figure 17:
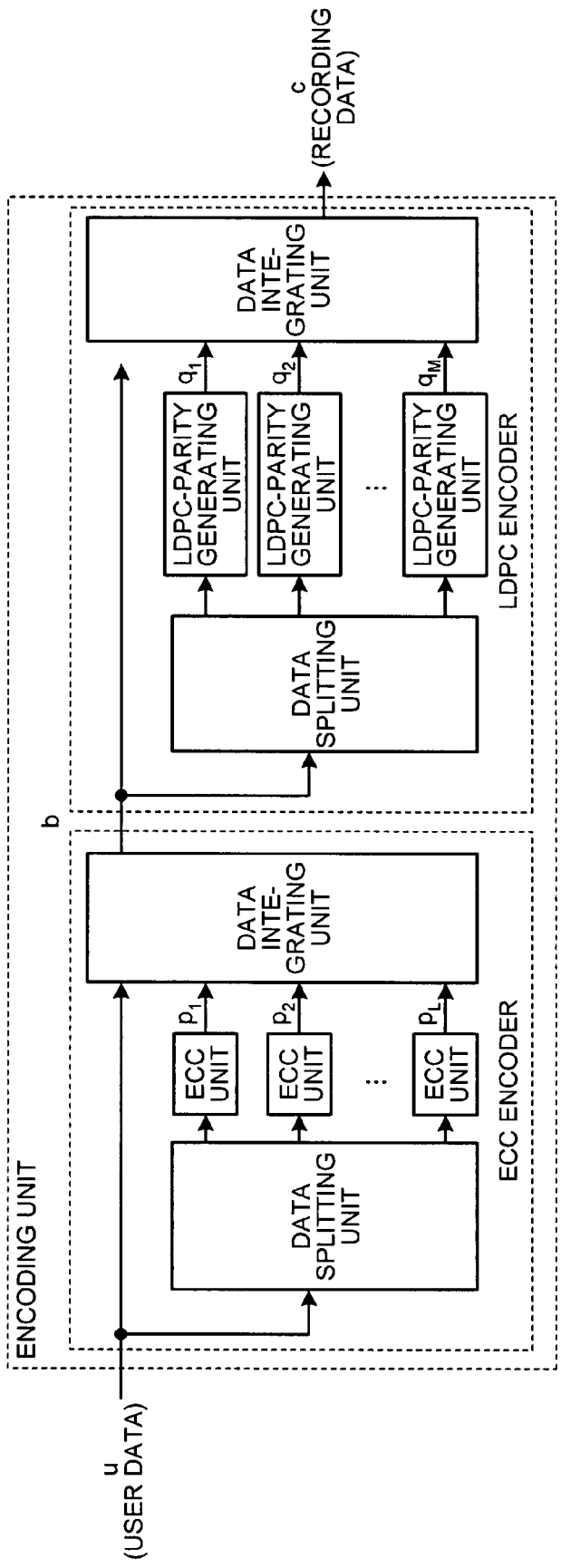
FIG. 17 is a block diagram of an encoding unit of a magnetic disk device according to a sixth embodiment of the present invention.

FIG. 17 is a block diagram of an encoding unit of a magnetic disk device according to a sixth embodiment of the present invention. The encoding unit of the sixth embodiment is basically similar in construction to the encoding unit 30 except that a sequence of process inside the circuit differs as is explained below.

As shown in FIG. 17, the data splitting unit of the ECC encoder splits the user data u into L data blocks. The ECC units calculate validity of data of each data block (detect data errors), generate the ECC parities $p_1$ to $p_L$ through ECC encoding for correcting the data to be valid within the correctable range, and output the ECC parities $p_1$ to $p_L$ to the data integrating unit. The data integrating unit integrates the data b with the ECC parities $p_1$ to $p_L$ received from the ECC units, and outputs the resultant data b to the LDPC encoder.

The data splitting unit of the LDPC encoder splits the data b into M data blocks. The LDPC-parity generating units generates the LDPC parties $q_1$ to $q_M$ through LDPC encoding for checking the validity of data in each data block (detect data errors) and calculating the likelihood, and output them to the data integrating unit. The data integrating unit integrates the user data u with the LDPC parities $q_1$ to $q_M$ received from the LDPC-parity generating units, and outputs the resultant data c (recorded data) to the PR channel.

Figure 18:
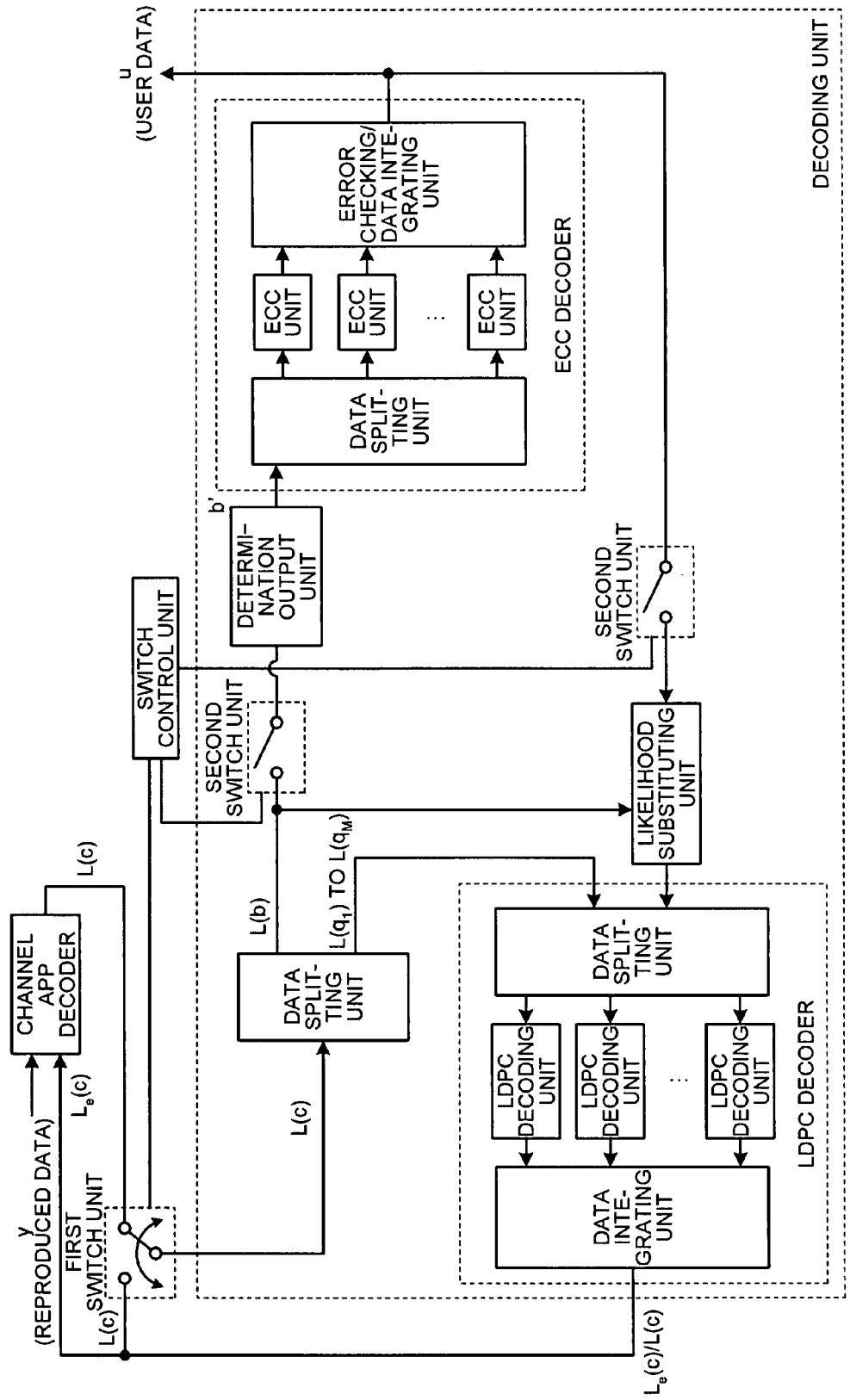
FIG. 18 is a block diagram of a decoding unit of the magnetic disk device according to the sixth embodiment.

FIG. 18 is a block diagram of a decoding unit of the magnetic disk device according to the sixth embodiment. The decoding unit of the sixth embodiment is basically similar in construction to the decoding unit 60 except that a sequence of process inside the circuit differs as is explained below.

After the channel APP decoder decodes the reproduced data y and the likelihoods $L(c)$ are input to the LDPC decoder via the data splitting unit and the likelihood substituting unit, the data splitting unit of the LDPC decoder splits the data into M data blocks. The LDPC decoding units decode data of each data block using LDPC parities. The data integrating unit integrates the M data blocks, and outputs the external data $L_e(c)$ to the channel APP decoder. After repeated decoding is performed between the channel APP decoder and the LDPC decoder in this manner, the LDPC decoder controls, via a switch control unit, a first switch unit to terminate a connection to the channel APP decoder, and second switch units to establish a connection to the ECC decoder. Thereafter, the LDPC decoder performs decoding of likelihood repeatedly with the ECC decoder. Upon repeated decoding of likelihood with the ECC decoder, the LDPC decoder outputs the posterior probability likelihood $L(c)$ to the ECC decoder as described in the above embodiments. The ECC decoding process is performed in the same manner as previously described, and detailed explanation thereof is not repeated.

The decoding process can be performed a predetermined number of times; the decoding process can also be performed until the likelihood of data of each data block of the user data is fixed to the maximum value, or until all data are determined to be valid (i.e., until all errors are corrected).

Otherwise, the magnetic disk device according to the sixth embodiment is of the same construction and operates in the same manner as the magnetic disk devices of the embodiments previously described.

According to the sixth embodiment, in addition to that it is possible to reduce the size of a circuit for implementing the decoding process of the likelihood, by appropriately linking and using the likelihood, i.e., the reliability which indicates, for each data represented by 0 or 1, possibility as to whether the data is represented by or 1 (soft data) and binary data that has been identified as 0 or 1 (hard data), the burst errors can be efficiently corrected.

While repeated decoding of likelihoods is performed between the ECC decoder and the LDPC decoder after repeated decoding of likelihoods between the channel APP decoder and the LDPC decoder in the sixth embodiment, this order can be changed. That is, repeated decoding of likelihoods can be performed between the ECC decoder and the LDPC decoder before repeated decoding of likelihoods between the channel APP decoder and the LDPC decoder. This decoding process can be arbitrarily set, as, for example, decoding between the channel APP decoder and the LDPC decoder and that between the ECC decoder and the LDPC decoder are performed alternately.

Besides, repeated decoding of likelihoods between the ECC decoder and the LDPC decoder is explained in the sixth embodiment. The decoding of the likelihoods can also be repeated between the CRC decoder explained in the second embodiment that determines validity of the data (detects errors) and the LDPC decoder.

The switch control unit switches the first switch unit and the second switch units at any timing such that the switching operation of the first and second switch units can be performed without any delay in the decoding process performed between the channel APP decoder and the LDPC decoder and between the ECC decoder and the LDPC decoder.

In the first embodiment, the respective ECC units 63b outputs data of each data block to the error checking/data integrating unit 63c. The error checking/data integrating unit 63c determines whether any error is left uncorrected with respect to each data block. If there is no error, the error checking/data integrating unit 63c outputs data b' obtained by integrating the data of the data blocks to the data splitting unit 62. If there is any data block in which an error remains, the error checking/data integrating unit 63c outputs data of each data block that has been corrected to be valid to the likelihood substituting unit 64. Having received the data that has been corrected to be valid from the ECC decoder 63, the likelihood substituting unit 64 substitutes the maximum value for the likelihood L(b) (obtained by the data splitting unit 62 deleting the ECC parities from the likelihood L(c)) corresponding to data of each data block corrected to be valid, and outputs the user data to the LDPC decoder 65. The following is a detailed description of the error checking/data integrating unit and the likelihood substituting unit.

Figure 19:
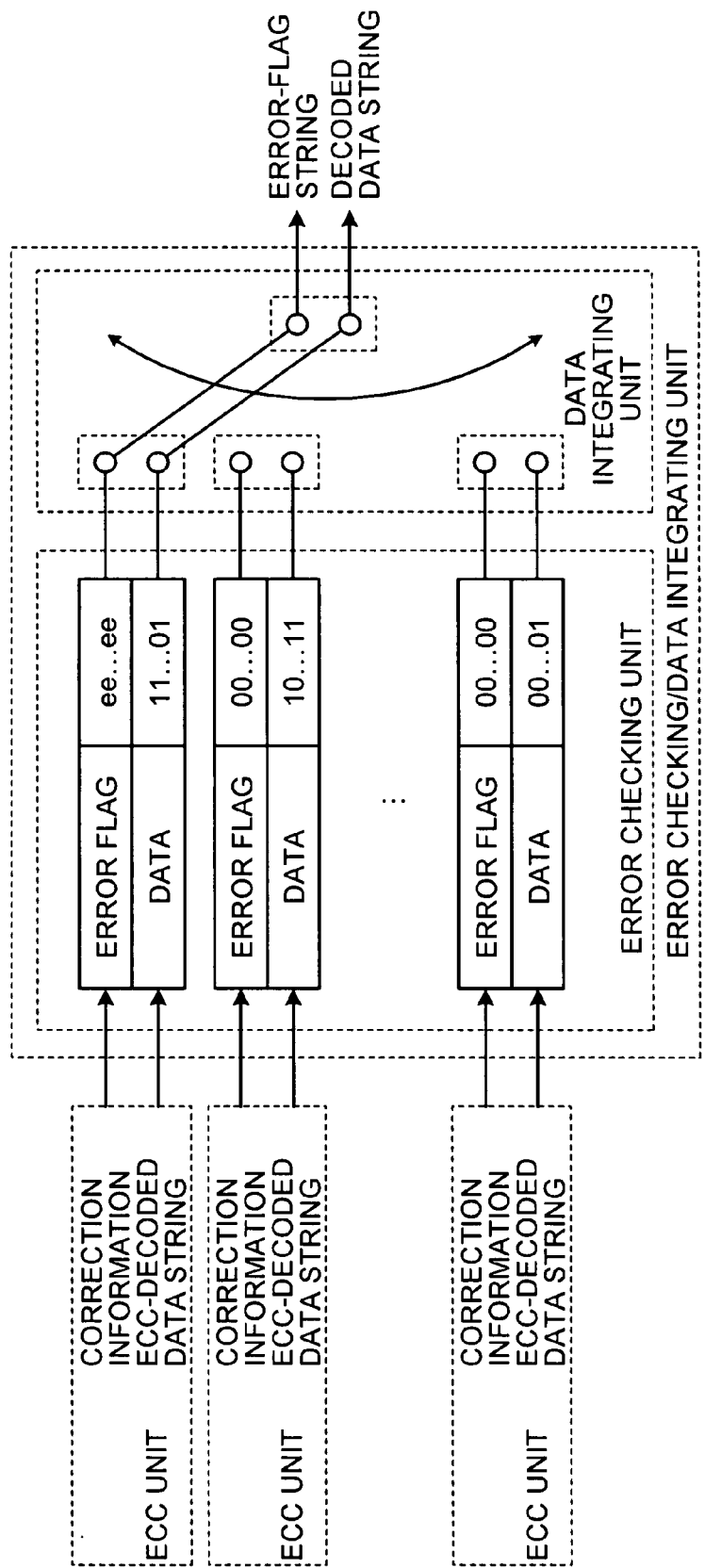
FIG. 19 is a block diagram of an error checking/data integrating unit of the magnetic disk device.

FIG. 19 is a block diagram of the error checking/data integrating unit. The error checking/data integrating unit includes an error checking unit and a data integrating unit.

The error checking unit receives from the ECC units correction information indicative of "correctable" or "uncorrectable" for determining whether correction has been possible within the correctable range, and data in which error has been corrected and from which ECC parities have been removed (or the data as it is when the data contains errors beyond the correctable range). The error checking unit checks the data based on the correction information. When the correction information indicates "uncorrectable", the error checking unit sets an error flag "e" indicating that a decoded bit may contain an error at a bit position corresponding to the decoded data to generate an error-flag string. The error checking unit outputs the error-flag string and a decoded data string to the data integrating unit. On the other hand, when the correction information indicates "correctable", the error checking unit sets an error flag "0" indicating that a decoded bit contains no error in an error-flag string, and outputs the error-flag string and a decoded data string to the data integrating unit. The data integrating unit integrates error-flag strings as well as decoded data strings received from the error checking unit, and outputs resultant error-flag string and decoded data string to the data splitting unit or the likelihood substituting unit.

Figure 20:
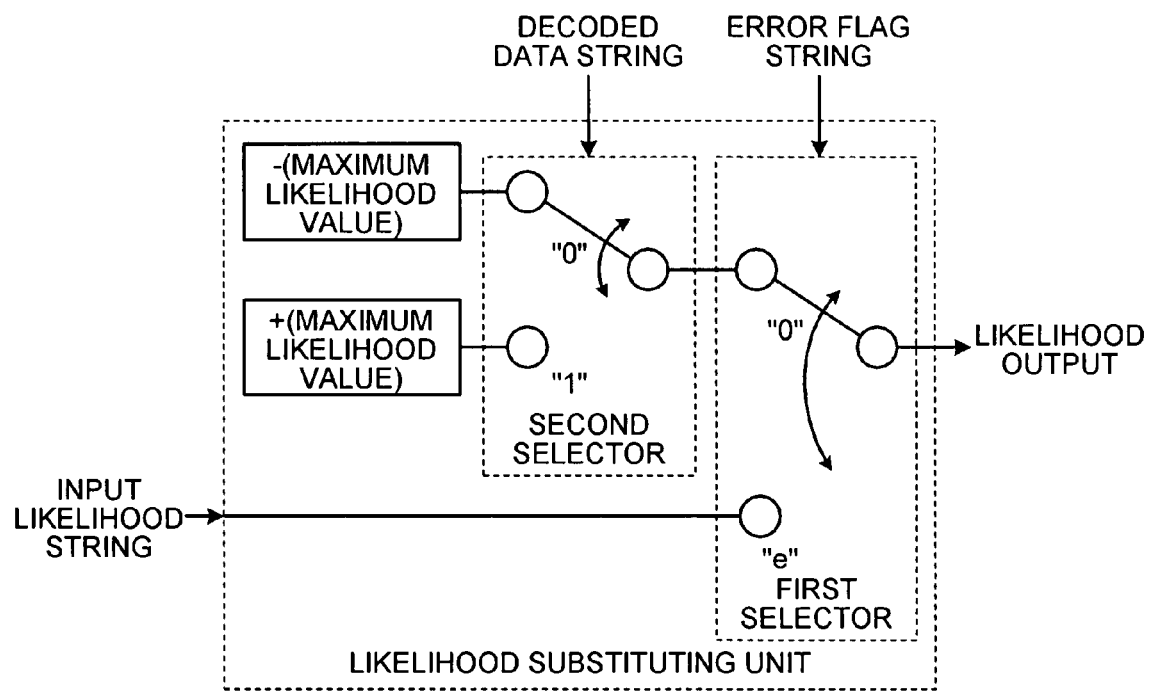
FIG. 20 is a block diagram of a likelihood substituting unit of the magnetic disk device.

FIG. 20 is a block diagram of the likelihood substituting unit. The likelihood substituting unit includes a first selector and a second selector. Upon receiving the error-flag string and the decoded data string from the data integrating unit, the likelihood substituting unit switches the first selector based on information from the error-flag string to select a source of the likelihood for each bit. Specifically, the likelihood substituting unit obtains the likelihood from an input likelihood string when an error flag in the error-flag string indicates "e", while it obtains the likelihood from the second selector when an error flag in the error-flag string indicates "0". Besides, the likelihood substituting unit switches the second selector according to the decoded data string to select a likelihood value for each bit. Specifically, the likelihood substituting unit selects a negative (−) maximum likelihood value when data in the decoded data string is represented by 0, while it selects a positive (+) maximum likelihood value when data in the decoded data string is represented by 1. The likelihood substituting unit outputs the likelihood thus obtained to the LDPC decoder.

As described above, with the error checking/data integrating unit and the likelihood substituting unit, bit error can be specified in data using less information. Thus, the size of a circuit for implementing the decoding process can be reduced, and high-speed processing can be realized.

In the first embodiment, the LDPC decoder 65 decodes the data with likelihoods partly substituted by the maximum value (belief propagation decoding) using LDPC parities to obtain likelihood of each data that constitutes user data (recalculate the possibility as to whether each data is represented by 1 or 0). The LDPC decoder 65 outputs the likelihood of each data as the external data $L_e(b)$ to the channel APP decoder 50 via the dummy inserting unit 66. The following is a detailed description of the LDPC decoder.

Figure 21:
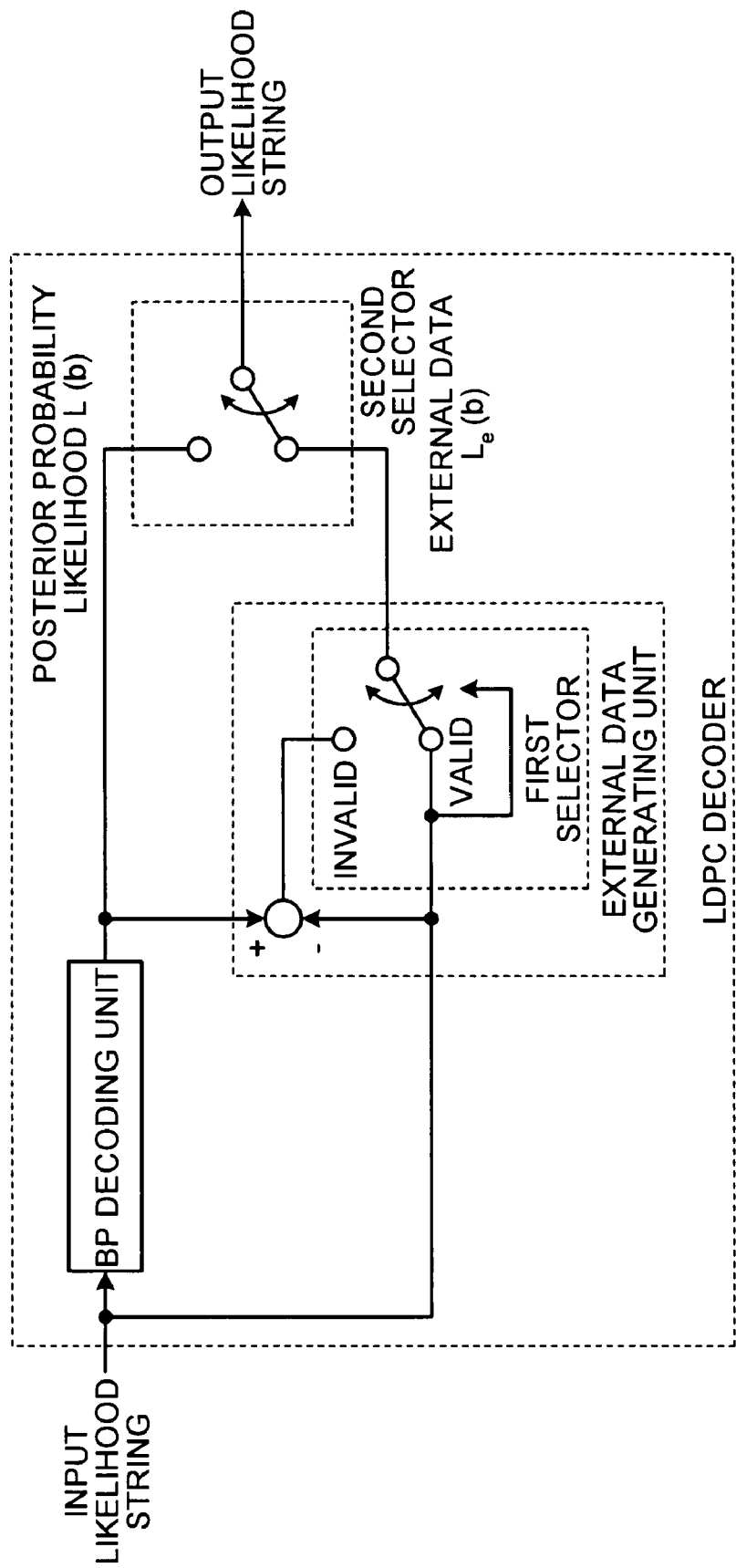
FIG. 21 is a block diagram of an LDPC decoder of the magnetic disk device.

FIG. 21 is a block diagram of the LDPC decoder. The LDPC decoder includes a BP decoding unit, an external data generating unit including a first selector, and a second selector.

When the LDPC decoder receives a likelihood string, the likelihood string is input to the BP decoding unit and the external data generating unit. The BP decoding unit performs belief propagation decoding using, for example, sum-product algorithm or min-sum algorithm according to LDPC parity-check rules.

Figure 22:
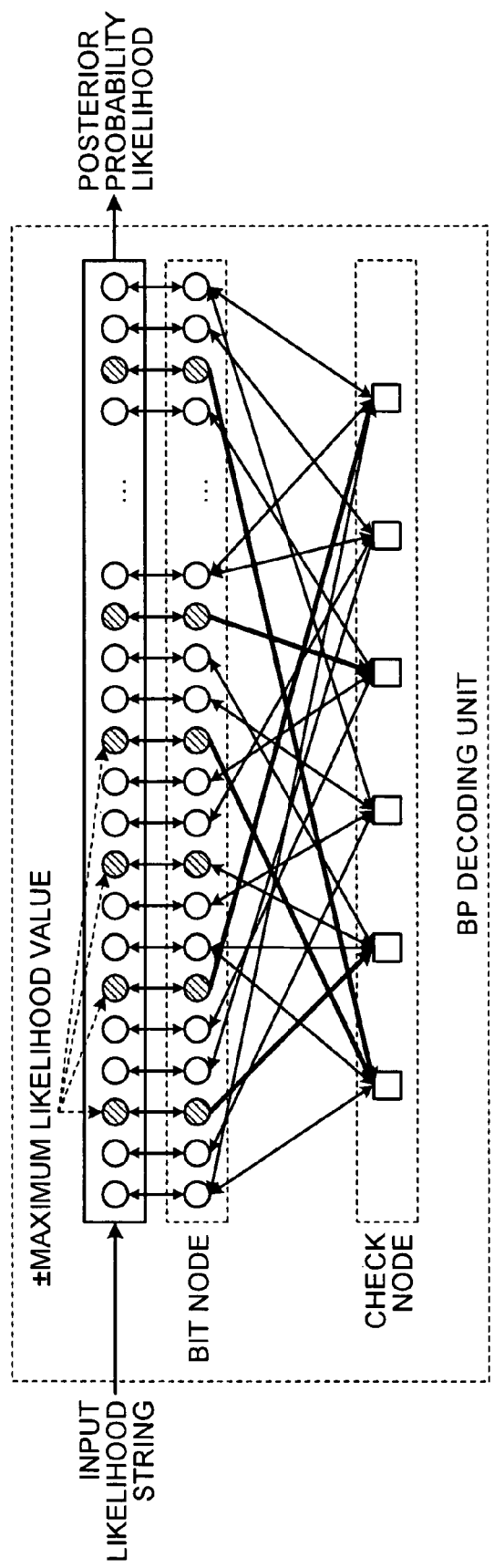
FIG. 22 is a schematic diagram for explaining an outline of the operation of a BP decoding unit shown in FIG. 21.
Figure 23:
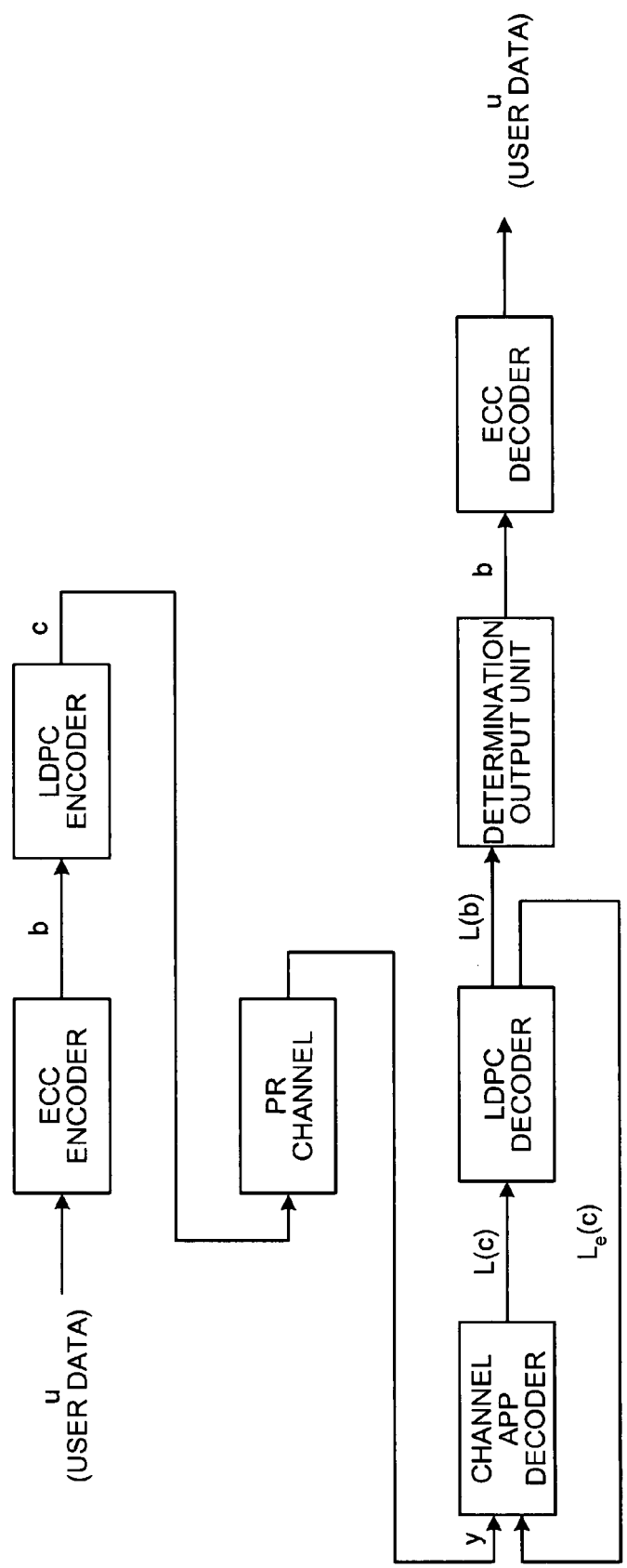
FIG. 23 is a block diagram for explaining a conventional technology.
Figure 24:
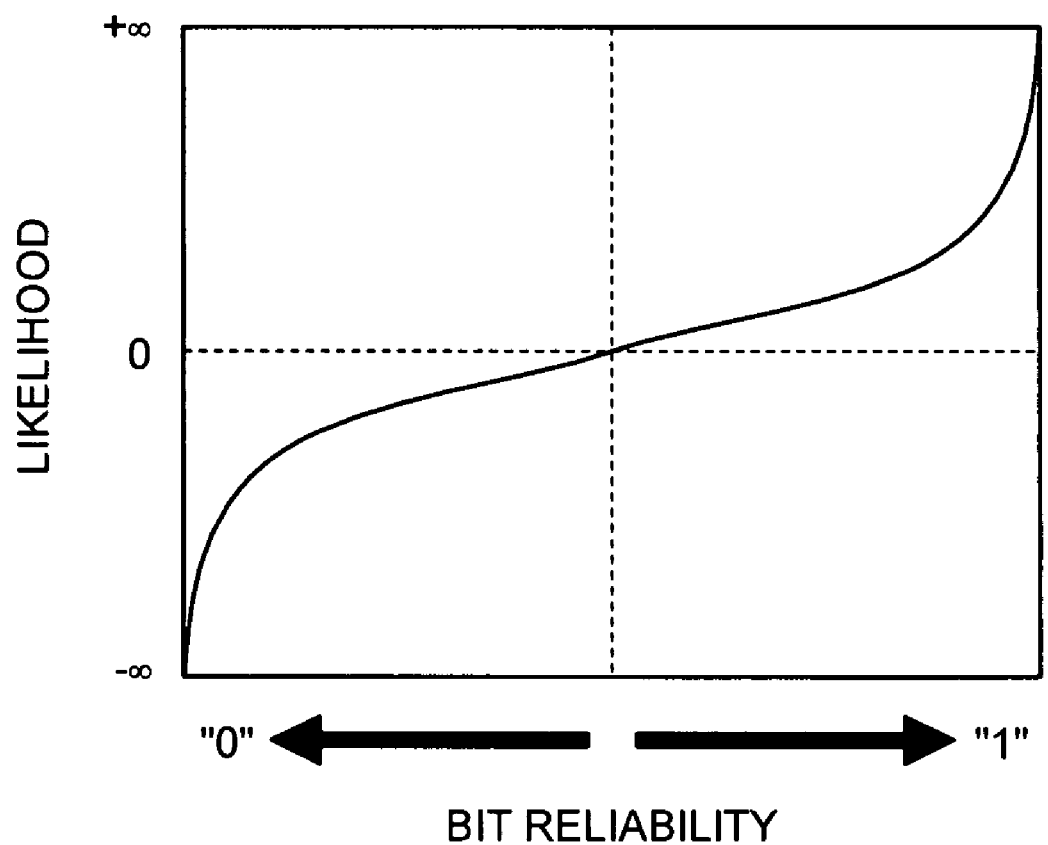
FIG. 24 is a graph for explaining likelihood.

FIG. 22 is a schematic diagram for explaining an outline of the operation of the BP decoding unit. In FIG. 22, Tanner graph representation is used for simplicity. As shown in FIG. 22, data of an input likelihood string is sent from a bit node to a check node according to the LDPC parity-check rules (corresponding to connection rules between the bit node and the check node). The check node performs check operation on the data, and sends the data back to the bit node after the check operation. The bit node performs bit operation on the data, thereby updating the likelihood. For data with the ± maximum likelihood value (with the likelihood substituted by the likelihood substituting unit 64), the bit node does not update the likelihood. In other words, the bit node does not performs bit operation on the data received from the check node. With this, it is possible to avoid erroneous updating of the likelihood in BP decoding.

The BP decoding unit obtains posterior probability likelihood by updating the likelihood through BP decoding as described above. The BP decoding unit outputs the posterior probability likelihood to the external data generating unit and the second selector.

The external data generating unit inputs external data obtained by subtracting input likelihood from the posterior probability likelihood to the first selector. The first selector determines whether the likelihood is the ± maximum value (likelihood substituted by the likelihood substituting unit 64). Having determined that the likelihood is the ± maximum value (valid), the first selector outputs the input likelihood string to the second selector. On the other hand, when the likelihood is not the ± maximum value (invalid), the first selector outputs the external data to the second selector.

The second selector outputs the external data $L_e(b)$ as prior data to the channel APP decoder. The second selector outputs the posterior probability likelihood L(b) to another unit except the channel APP decoder (e.g., sends it back to the ECC decoder).

As described above, the ± maximum likelihood value substituted by the likelihood substituting unit 64 is retained in the external data $L_e(b)$, which enables the channel APP decoder to perform accurate decoding. As a result, highly accurate likelihood can be obtained. Moreover, as well as reducing the size of a circuit for implementing the decoding process, it is possible to reduce the number of repeated decoding between the channel APP decoder and the LDPC decoder. Thus, high-speed processing can be realized.

The constituent elements of the magnetic disk device explained above are merely conceptual and may not necessarily physically resemble the structure shown in the drawings. In other words, the magnetic disk device need not necessarily be configured as illustrated. For example, the encoding unit, the PR channel, the channel APP decoder, and the decoding unit in the read channel, as a whole or in part, can be separated or integrated either functionally or physically in accordance with the load or how the device is to be used. The same function as the magnetic disk device can be entirely or partially realized by a computer program. In such case, the MPU 5 or the CPU loads the computer program into, for example, the memory 6, and executes the computer program.

As set forth hereinabove, according to an embodiment of the present invention, an encoding apparatus generates first encoded data (e.g., parity bits generated by encoding using an LDPC code or a turbo code) by first encoding for calculating validity and likelihood ratio (reliability that indicates, for each data represented by 0 or 1, possibility as to whether the data is represented by 0 or 1) of data that constitutes user data. The first encoded data is added to the user data to obtain first data to be divided into data blocks. Then, the encoding apparatus generates second encoded data (e.g., parity bits generated by encoding using a CRC code or a Humming code) by second encoding for determining validity of data in each of the data blocks. The second encoded data is added to the first data to obtain second data. Thus, for decoding each encoded data, validity information (information on the presence or absence of an error) can be obtained for use in correcting burst errors that have occurred in the user data.

Moreover, decoding apparatus decodes the reproduced data of the second data and calculates validity and likelihood ratio (soft data on reliability that indicates, for each data represented by 0 or 1, possibility as to whether the data is represented by 0 or 1) of data that constitutes the second data. After the first data in the decoded second is divided into the data blocks, the decoding apparatus performs decoding using the second encoded data to check the validity of data in each of the data blocks, and resets a likelihood ratio of data with no error to the maximum value (e.g., resets the reliability, which indicates, for each data represented by 0, 1 or a combination of 0 and 1, possibility as to whether the data is represented by 0 or 1, to the maximum value) based on a result of the decoding. User data including a likelihood ratio reset to the maximum value is decoded using the first encoded data to check the validity and to calculate the likelihood ratio of the data that constitutes the user data. Thus, the likelihood (soft data) of each data in data blocks in which no error has been detected by the CRC code or the Humming code is set to the maximum value. By using the likelihood for decoding using the LDPC code or the turbo code, a consistency between decoding by the LDPC code or the turbo code and decoding by the CRC code or the Humming code can be achieved (i.e., the soft data and the hard data are appropriately linked and used), and the burst errors can be corrected.

Furthermore, third encoded data (e.g., parity bits generated by encoding using an RS code or a BCH code) generated by third encoding for determining validity of data in each of the data blocks and correcting invalid data to be valid within a correctable range can be added to the first data to obtain third data. Thus, for decoding each encoded data, validity information (information on the presence or absence of an error) can be obtained for use in correcting the burst errors that have occurred in the user data. In this case, the decoding apparatus decodes the reproduced data of the third data and calculates a likelihood ratio of data that constitutes the third data. Thus, the likelihood (soft data) of each data in data blocks in which invalid data is corrected to be valid by the RS code or the BCH code is set to the maximum value. By using the likelihood for decoding using the LDPC code or the turbo code, a consistency between decoding by the LDPC code or the turbo code and decoding by the RS code or the BCH code can be achieved (i.e., the soft data and the hard data are appropriately linked and used), and the burst errors can be corrected.

Moreover, the likelihood of each data is set to the maximum value based on hard data (binary data that has been identified as 0 or 1) i.e., the result of decoding with the CRC code, Humming code, RS code or BCH code. By using the likelihood for decoding with the LDPC code or the turbo code, a consistency between decoding by the LDPC code or the turbo code and decoding by the CRC code or the Humming code can be achieved (i.e., the soft data and the hard data are appropriately linked and used), and the burst errors can be corrected.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. An encoding apparatus that encodes data, comprising:
a first encoding unit that performs first encoding for calculating validity and a likelihood ratio of data that constitutes user data to generate first encoded data, and adds the first encoded data to the user data to obtain first data; and
a second encoding unit that divides the first data into data blocks, performs second encoding for determining validity of data in each of the data blocks and correcting invalid data to be valid within a correctable range to generate second encoded data, and adds the second encoded data to the first data to obtain second data.

2. The encoding apparatus according to claim 1, wherein the first encoding unit divides the user data into data blocks, and determines validity of data in each of the data blocks.

3. A decoding apparatus that decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks, the decoding apparatus comprising:
a likelihood decoding unit that decodes the reproduced data of the second data and calculates a likelihood ratio of data that constitutes the second data;
a first decoding unit that divides the first data in the second data into the data blocks after decoding by the likelihood decoding unit, and performs decoding using the second encoded data to check the validity of data in each of the data blocks;
a likelihood resetting unit that resets a likelihood ratio of data included in the decoding data blocks checked to be valid by the first decoding unit to a maximum value; and
a second decoding unit that decodes user data with the likelihood ratio reset to the maximum value using the first encoded data, and calculates the likelihood ratio of the data that constitutes the user data.

4. The decoding apparatus according to claim 3, wherein the second decoding unit repeatedly decodes the user data a predetermined number of times, until a likelihood ratio of every data in data blocks of the user data is reset to the maximum value, or until the every data is determined to be valid.

5. The decoding apparatus according to claim 3, wherein
the likelihood decoding unit decodes the reproduced data of the second data each time the likelihood ratio of the data that constitutes the user data is calculated, and recalculates the likelihood ratio of the data that constitutes the second data,
the first decoding unit performs the decoding each time the likelihood ratio of the data that constitutes the second data is calculated to recheck the validity of data in each of the data blocks,
the likelihood resetting unit resets a likelihood ratio of data with no error to the maximum value each time the validity of data in each of the data blocks is determined, and
the second decoding unit decodes the user data each time the likelihood ratio of the data is reset to the maximum value, and recalculates the likelihood ratio of the data that constitutes the user data.

6. The decoding apparatus according to claim 3, wherein
the first decoding unit performs the decoding each time the likelihood ratio of the data that constitutes the user data is calculated to recheck the validity of data in each of the data blocks,
the likelihood resetting unit resets a likelihood ratio of data with no error to the maximum value each time the validity of data in each of the data blocks is determined, and
the second decoding unit decodes the user data each time the likelihood ratio of the data is reset to the maximum value, and recalculates the likelihood ratio of the data that constitutes the user data.

7. A decoding apparatus that decodes reproduced data of third data that includes first data obtained by generating first encoded data with first encoding for calculating validity and a likelihood ratio of data that constitutes user data and adding the first encoded data to the user data, and third encoded data generated by, after the first data is divided into data blocks, third encoding for determining validity of data in each of the data blocks and correcting invalid data to be valid within a correctable range, the decoding apparatus comprising:
a likelihood decoding unit that decodes the reproduced data of the third data and calculates a likelihood ratio of data that constitutes the third data;
a third decoding unit that divides the first data in the third data into the data blocks after decoding by the likelihood decoding unit, and performs decoding using the third encoded data to check the validity of data in each of the data blocks and correct invalid data to be valid within the correctable range;
a likelihood resetting unit that resets a likelihood ratio of data corrected to be valid to a maximum value based on a result of decoding by the third decoding unit; and
a second decoding unit that decodes user data with the likelihood ratio reset to the maximum value using the first encoded data, and calculates the likelihood ratio of the data that constitutes the user data.

8. The decoding apparatus according to claim 7, wherein the second decoding unit repeatedly decodes the user data a predetermined number of times, until a likelihood ratio of every data in data blocks of the user data is reset to the maximum value, or until the every data is determined to be valid.

9. The decoding apparatus according to claim 7, wherein
the likelihood decoding unit decodes the reproduced data of the third data each time the likelihood ratio of the data that constitutes the user data is calculated, and recalculates the likelihood ratio of the data that constitutes the third data,
the third decoding unit performs the decoding each time the likelihood ratio of the data that constitutes the third data is calculated to recheck the validity of data in each of the data blocks and recorrect invalid data to be valid within the correctable range,
the likelihood resetting unit resets, each time data is correct to be valid, a likelihood ratio of the data corrected to be valid to the maximum value, and
the second decoding unit decodes the user data each time the likelihood ratio of the data is reset to the maximum value, and recalculates the likelihood ratio of the data that constitutes the user data.

10. The decoding apparatus according to claim 7, wherein
the third decoding unit performs the decoding each time the likelihood ratio of the data that constitutes the user data is calculated to recheck the validity of data in each of the data blocks and recorrect invalid data to be valid within the correctable range,
the likelihood resetting unit resets, each time data is correct to be valid, a likelihood ratio of the data corrected to be valid to the maximum value, and
the second decoding unit decodes the user data each time the likelihood ratio of the data is reset to the maximum value, and recalculates the likelihood ratio of the data that constitutes the user data.

11. A decoding apparatus that decodes reproduced data of second data that includes user data, first encoded data generated by, after the user data is divided into data blocks, first encoding for determining validity of data in each of the data blocks and correcting invalid data to be valid within a correctable range, and second encoded data generated by second encoding for calculating a likelihood ratio of data that constitutes first data obtained by adding the first encoded data to the user data, the decoding apparatus comprising:
a likelihood decoding unit that decodes the reproduced data of the second data and calculates a likelihood ratio of data that constitutes the second data;
a first decoding unit that decodes the first data in the second data after decoding by the likelihood decoding unit using the second encoded data and calculates a likelihood ratio of the data that constitutes the first data;
a second decoding unit that divides the first data decoded by the first decoding unit into data blocks, and performs decoding using the first encoded data to check the validity of data in each of the data blocks and correct invalid data to be valid within the correctable range; and
a likelihood resetting unit that resets a likelihood ratio of data included in the decoding data blocks corrected to be valid by the second decoding unit to a maximum value, wherein
the likelihood decoding unit decodes the reproduced data of the second data each time the likelihood ratio of the data that constitutes the first data is calculated, and recalculates the likelihood ratio of the data that constitutes the second data, the first decoding unit calculates the likelihood ratio of the data that constitutes the first data each time the likelihood ratio of the data that constitutes the second data is calculated, the second decoding unit performs the decoding each time the likelihood ratio of the data that constitutes the first data is calculated, and the likelihood resetting unit resets, each time invalid data in the data blocks is corrected to be valid, a likelihood ratio of the data to the maximum value.

12. An encoding method applied to an encoding apparatus, comprising:

performing first encoding for calculating validity and a likelihood ratio of data that constitutes user data to generate first encoded data;

adding the first encoded data to the user data to obtain first data;

dividing the first data into data blocks;

performing second encoding for determining validity of data in each of the data blocks and correcting invalid data to be valid within a correctable range to generate second encoded data; and adding the second encoded data to the first data to obtain second data.

13. The encoding method according to claim 12, wherein the performing first encoding includes dividing the user data into data blocks and determining validity of data in each of the data blocks.

14. A decoding method that is applied to a decoding apparatus that decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks, the decoding method comprising:

decoding the reproduced data of the second data to calculate a likelihood ratio of data that constitutes the second data;

dividing the first data in the second data into the data blocks after decoding;

performing first decoding with the second encoded data to check the validity of data in each of the data blocks;

resetting a likelihood ratio of data included in the decoding data blocks checked to be valid at the first decoding to a maximum value; and performing second decoding to decode user data with the likelihood ratio reset to the maximum value using the first encoded data to calculate the likelihood ratio of the data that constitutes the user data.

15. The decoding method according to claim 14, wherein the second decoding unit repeatedly decodes the user data a predetermined number of times, until a likelihood ratio of every data in data blocks of the user data is reset to the maximum value, or until the every data is determined to be valid.

16. The decoding method according to claim 14, wherein the decoding includes decoding the reproduced data of the second data each time the likelihood ratio of the data that constitutes the user data is calculated to recalculate the likelihood ratio of the data that constitutes the second data, the performing first decoding includes performing the decoding each time the likelihood ratio of the data that constitutes the second data is calculated to recheck the validity of data in each of the data blocks, the resetting includes resetting a likelihood ratio of data with no error to the maximum value each time the validity of data in each of the data blocks is determined, and the performing second decoding includes decoding the user data each time the likelihood ratio of the data is reset to the maximum value to recalculate the likelihood ratio of the data that constitutes the user data.

17. The decoding method according to claim 14, wherein the performing first decoding includes performing the decoding each time the likelihood ratio of the data that constitutes the user data is calculated to recheck the validity of data in each of the data blocks, the resetting includes resetting a likelihood ratio of data with no error to the maximum value each time the validity of data in each of the data blocks is determined, and the performing second decoding includes decoding the user data each time the likelihood ratio of the data is reset to the maximum value to recalculate the likelihood ratio of the data that constitutes the user data.

18. A decoding method that is applied to a decoding apparatus that decodes reproduced data of third data that includes first data obtained by generating first encoded data with first encoding for calculating validity and a likelihood ratio of data that constitutes user data and adding the first encoded data to the user data, and third encoded data generated by, after the first data is divided into data blocks, third encoding for determining validity of data in each of the data blocks and correcting invalid data to be valid within a correctable range, the decoding method comprising:

decoding the reproduced data of the third data to calculate a likelihood ratio of data that constitutes the third data;

dividing the first data in the third data into the data blocks after decoding;

performing third decoding with the third encoded data to check the validity of data in each of the data blocks and correct invalid data to be valid within the correctable range;

resetting a likelihood ratio of data corrected to be valid to a maximum value based on a result of the third decoding; and performing second decoding to decode user data with the likelihood ratio reset to the maximum value using the first encoded data to calculate the likelihood ratio of the data that constitutes the user data.

19. The decoding method according to claim 18, wherein the second decoding unit repeatedly decodes the user data a predetermined number of times, until a likelihood ratio of every data in data blocks of the user data is reset to the maximum value, or until the every data is determined to be valid.

20. The decoding method according to claim 18, wherein the decoding includes decoding the reproduced data of the third data each time the likelihood ratio of the data that constitutes the user data is calculated to recalculate the likelihood ratio of the data that constitutes the third data, the performing third decoding includes performing the decoding each time the likelihood ratio of the data that constitutes the third data is calculated to recheck the validity of data in each of the data blocks and recorrect invalid data to be valid within the correctable range, the resetting includes resetting, each time data is correct to be valid, a likelihood ratio of the data corrected to be valid to the maximum value, and the performing second decoding includes decoding the user data each time the likelihood ratio of the data is reset to the maximum value to recalculate the likelihood ratio of the data that constitutes the user data.

21. The decoding method according to claim 18, wherein
the performing third decoding includes performing the decoding each time the likelihood ratio of the data that constitutes the user data is calculated to recheck the validity of data in each of the data blocks and recorrect invalid data to be valid within the correctable range,
the resetting includes resetting, each time data is correct to be valid, a likelihood ratio of the data corrected to be valid to the maximum value, and
the performing second decoding includes decoding the user data each time the likelihood ratio of the data is reset to the maximum value to recalculate the likelihood ratio of the data that constitutes the user data.

22. A storage device comprising:
an encoding apparatus that encodes data; and
a decoding apparatus that decodes reproduced data of second data that includes first data obtained by generating first encoded data with first encoding for calculating validity and a likelihood ratio of data that constitutes user data and adding the first encoded data to the user data, and second encoded data generated by, after the first data is divided into data blocks, second encoding for determining validity of data in each of the data blocks, wherein
the encoding apparatus includes
    a first encoding unit that performs first encoding for calculating validity and a likelihood ratio of data that constitutes user data to generate first encoded data, and adds the first encoded data to the user data to obtain first data; and
    a second encoding unit that divides the first data into data blocks, performs second encoding for determining validity of data in each of the data blocks and correcting invalid data to be valid within a correctable range to generate second encoded data, and adds the second encoded data to the first data to obtain second data, and
the decoding apparatus includes
    a likelihood decoding unit that decodes the reproduced data of the second data and calculates a likelihood ratio of data that constitutes the second data;
    a first decoding unit that divides the first data in the second data into the data blocks after decoding by the likelihood decoding unit, and performs decoding using the second encoded data to check the validity of data in each of the data blocks;
    a likelihood resetting unit that resets a likelihood ratio of data included in the decoding data blocks checked to be valid by the first decoding unit to a maximum value; and
    a second decoding unit that decodes user data with the likelihood ratio reset to the maximum value using the first encoded data, and calculates the likelihood ratio of the data that constitutes the user data.

* * * * *